(12) United States Patent
Kim

(10) Patent No.: US 12,431,095 B2
(45) Date of Patent: Sep. 30, 2025

(54) DISPLAY DEVICE

(71) Applicant: LG Display Co., Ltd., Seoul (KR)

(72) Inventor: Jonghoy Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/520,031

(22) Filed: Nov. 27, 2023

(65) Prior Publication Data

US 2024/0221686 A1 Jul. 4, 2024

(30) Foreign Application Priority Data

Dec. 30, 2022 (KR) .................... 10-2022-0190196

(51) Int. Cl.
*G09G 3/3233* (2016.01)
*G09G 3/3291* (2016.01)
*H10K 59/131* (2023.01)

(52) U.S. Cl.
CPC ......... *G09G 3/3291* (2013.01); *G09G 3/3233* (2013.01); *H10K 59/131* (2023.02); *G09G 2300/0426* (2013.01)

(58) Field of Classification Search
CPC ............... H10K 59/131; G09G 3/3233; G09G 2300/0426
See application file for complete search history.

(56) References Cited

U.S. PATENT DOCUMENTS

| | | | |
|---|---|---|---|
| 11,562,705 B2 | 1/2023 | Cho | |
| 2004/0257355 A1* | 12/2004 | Naugler | G09G 3/3291 |
| | | | 345/204 |
| 2018/0061294 A1* | 3/2018 | Kim | G09G 3/367 |
| 2021/0035514 A1* | 2/2021 | Cho | G09G 3/3648 |
| 2023/0075883 A1* | 3/2023 | Jun | H10K 59/40 |
| 2023/0157129 A1* | 5/2023 | Shin | H10K 59/121 |
| | | | 257/40 |

FOREIGN PATENT DOCUMENTS

KR 10-2021-0014262 A 2/2021

OTHER PUBLICATIONS

Korean Intellectual Property Office, Office Action, Korean Patent Application No. 10-2022-0190196, Dec. 18, 2024, 14 pages.

* cited by examiner

*Primary Examiner* — Yuzhen Shen
(74) *Attorney, Agent, or Firm* — Fenwick & West LLP

(57) ABSTRACT

Disclosed is a display device including: a display panel including a display area comprising a normal area and an optical area, and a non-display area disposed around the display area, a substrate, and a first driving voltage line and a second driving voltage line on the substrate; and an optical electronic device disposed on the optical area, wherein the first driving voltage line provides a first driving voltage to a pixel of the normal area, and wherein the second driving voltage line provides a second driving voltage that is greater than the first driving voltage to a pixel of the optical area. Accordingly, the display device compensates for a difference in brightness between an optical area where an optical electronic device is arranged and a normal area where the optical electronic device is not arranged.

15 Claims, 22 Drawing Sheets

DISPLAY DEVICE

CROSS REFERENCE TO RELATED APPLICATION

The present application claims priority to Republic of Korea Patent Application No. 10-2022-0190196, filed Dec. 30, 2022, which is hereby incorporated by reference in its entirety.

BACKGROUND

Field of Technology

The disclosure relates to a display device.

Description of the Related Art

A display panel of a display device may include a display element for displaying an image, a driving element for driving the display element, and wiring for transmitting various signals to the display element and the driving element. The display element may be defined differently according to the types of the display panel. For example, when the display panel is an organic light emitting display panel, the display element may be an organic light emitting diode that include an anode, a light emitting layer, and a cathode.

The display device may include one or more optical electronic devices. The optical electronic device may include a camera, a sensor, or the like light receiving device that receives light.

SUMMARY

An embodiment of the disclosure is to provide a display device that compensates for a difference in brightness between an optical area where an optical electronic device is arranged and a normal area where the optical electronic device is not arranged.

According to an embodiment of the disclosure, there is provided a display device including: a display panel including a display area including a normal area and an optical area around the normal area, a non-display area disposed around the display area, a substrate, and a first driving voltage line and a second driving voltage line on the substrate; and an optical electronic device disposed on the optical area, wherein the first driving voltage line provides a first driving voltage to a pixel of the normal area, and wherein the second driving voltage line provides a second driving voltage higher than the first driving voltage to a pixel of the optical area.

According to another embodiment of the disclosure, there is provided a display device including: a display panel including a display area including a normal area and an optical area around the normal area, a non-display area disposed around the display area, a substrate, and a first driving voltage line and a second driving voltage line on the substrate, wherein the number of pixels per unit area in the normal area are more than the number of pixels per unit area in the optical area, the first driving voltage line provides a first driving voltage to a pixel of the normal area, and the second driving voltage line provides a second driving voltage higher than the first driving voltage to a pixel of the optical area.

Problems to be solved in the disclosure are not limited to the aforementioned problems, and other unmentioned problems can be clearly understood from the following description by those skilled in the art.

According to an embodiment, a display device compensates for a difference in brightness between an optical area and a normal area where an optical electronic device is not arranged.

Effects obtainable from the disclosure may not be limited by the aforementioned effects, and other unmentioned effects can be clearly understood from the following description by a person having ordinary knowledge in the art to which the disclosure pertains.

DETAILED DESCRIPTION

Figure 1:
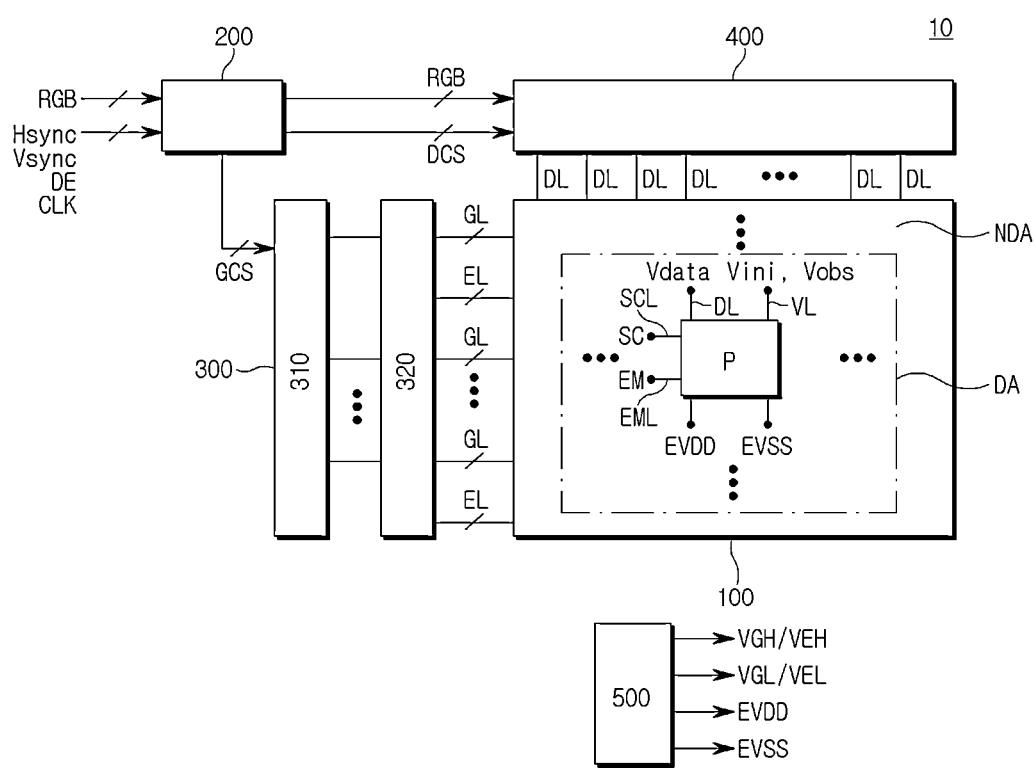
FIG. 1 is a schematic block diagram of a display device according to an embodiment.

Advantages and features of the disclosure and methods of accomplishing the same may be understood more readily by reference to the detailed description of embodiments that will be made hereinafter with reference to the accompanying drawings. The disclosure may, however, be embodied in many different forms and should not be construed as being limited to the exemplary embodiments set forth herein; rather, these exemplary embodiments are provided so that the disclosure will be thorough and complete and will fully convey the concept of the invention to those skilled in the art, and the present invention will only be defined by the appended claims. Throughout the specification, the same reference numerals refer to the same elements.

It will be understood that when an element is referred to as being "connected" or "coupled" to another element, it can be directly connected or coupled to the other element or intervening elements may be present. On the other hand, when an element is referred to as being "directly connected" or "directly coupled" to another element, there are no intervening elements present. In the following, "and/or" includes each of mentioned items and all combinations of one or more items.

The terminology used herein is for the purpose of describing embodiments and is not intended to limit the disclosure. In the disclosure, the singular forms include plural forms unless particularly mentioned. The terms "comprises" and/or "comprising" used herein do not exclude the presence or addition of one or more other elements, steps, operations, and/or devices in addition to the aforementioned elements, steps, operations, and/or devices.

Although the terms "first", "second", and the like are used to describe various elements, these elements are not limited by these terms. These terms are used for merely distinguishing one element from another element.

Therefore, a first element described below may be a second element within the scope of the disclosure. Unless otherwise defined, all terms (including technical and scientific terms) used in the disclosure may be used as meanings that can be commonly understood by a person having ordinary knowledge in the art to which the disclosure belongs. Further, terms defined in a commonly used dictionary are not interpreted ideally or excessively unless explicitly defined specifically.

FIG. 1 is a schematic block diagram of a display device according to an embodiment.

Referring to FIG. 1, a display device 10 includes a display panel 100 including a plurality of pixels P, a controller 200, a gate driver 300 supplying a gate signal to each of the plurality of pixels P, a data driver 400 supplying a data signal to each of the plurality of pixels P, and a power supply 500 supplying driving power to each of the plurality of pixels P.

The display panel 100 includes a display area DA where the pixels P are located, and a non-display area NDA which surrounds the display area DA and where the gate driver 300 and the data driver 400 are located.

In the display panel 100, a plurality of gate lines GL and a plurality of data lines DL intersect each other, and each of the plurality of pixels P is connected to the gate line GL and the data line DL. Specifically, one pixel P receives a gate signal from the gate driver 300 through the gate line GL, receives a data signal from the data driver 400 through the data lines DL, and receives a high-potential driving voltage EVDD and a low-potential driving voltage EVSS from the power supply 500.

Here, the gate line GL is used to supply a scan signal SC and an emission control signal EM, and the data line DL is used to supply a data voltage Vdata. Further, according to various embodiments, the gate lines GL may include a plurality of scan lines SCL to supply the scan signals SC, and an emission control signal line EML to supply the emission control signal EM. Further, the plurality of pixels P may receive a bias voltage Vobs, and an initialization voltage Var or Vini through an additional power line VL.

Figure 2:
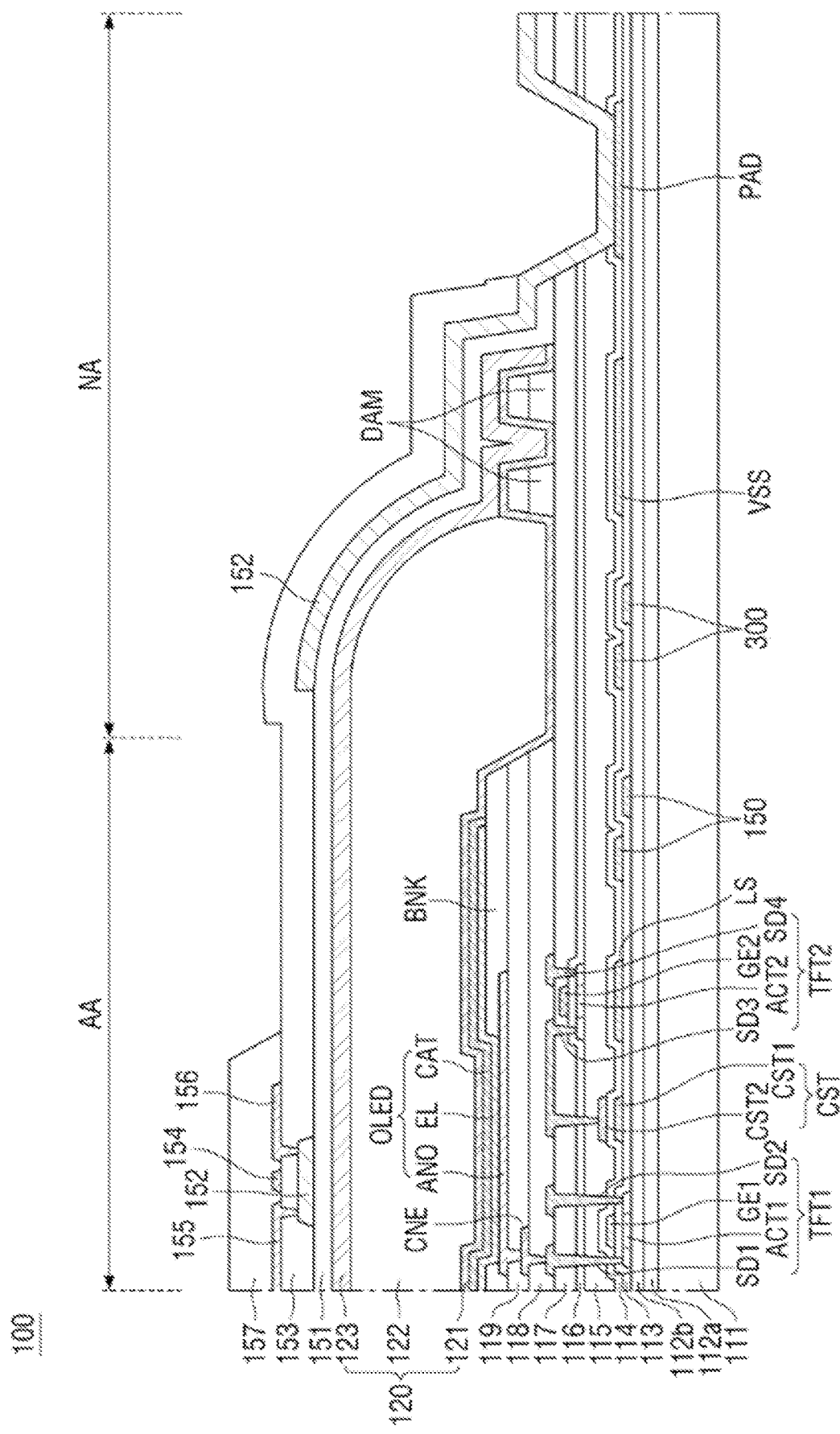
FIG. 2 is a cross-sectional view showing a stacked structure of a display device according to an embodiment.

Further, each pixel P, as shown in FIG. 2, includes a light emitting diode OLED and a pixel circuit to control driving of the light emitting diode OLED. Here, the light emitting diode OLED includes an anode ANO, a cathode CAT, and an emissive layer EL disposed between the anode ANO and the cathode CAT.

The pixel circuit includes a plurality of switching elements, driving elements, and capacitors. Here, the switching element and the driving element may be implemented by thin film transistors. In the pixel circuit, the driving element controls the amount of current supplied to the light emitting diode OLED according to data voltages, thereby adjusting the amount of light emitted from the light emitting diode OLED. Further, the plurality of switching elements receives the scan signals SC supplied through the plurality of scan lines SCL and the emission control signal EM supplied through the emission control line EML, thereby operating the pixel circuit.

The display panel 100 may be implemented as a non-transmissive display panel or a transmissive display panel. The transmissive display panel may be applied to a transparent display device where an image is displayed on a screen and real objects are visible in the background. The display panel 100 may be made of a flexible display panel. The flexible display panel may be implemented as an OLED panel using a plastic substrate.

Each pixel P may be divided into a red pixel, a green pixel, and a blue pixel to reproduce colors. Each pixel P may further include a white pixel. Each pixel P includes a pixel circuit.

The display panel 100 may include touch sensors disposed thereon. A touch input may be detected through separate touch sensors or through the pixels P. The touch sensors may be implemented as on-cell or add-on type touch sensors disposed on the screen of the display panel, or as in-cell type touch sensors embedded in the display panel 100.

The controller 200 processes image data RGB received from the outside to be suitable for the size and resolution of the display panel 100, and supplies the processed data to the data driver 400. The controller 200 generates a gate control signal GCS and a data control signal DCS based on synchronization signals received from the outside, for example, a dot clock signal CLK, a data enable signal DE, a horizontal synchronization signal Hsync, and a vertical synchronization signal Vsync. By supplying the generated gate control signal GCS and the generated data control signal DCS to the gate driver 300 and the data driver 400, the gate driver 300 and the data driver 400 are controlled.

The controller 200 may be configured in combination with various processors, for example, a microprocessor, a mobile processor, an application processor, etc. according to devices to which it is mounted.

A host system may be one of a television (TV) system, a set-top box, a navigation system, a personal computer (PC), a home theater system, a mobile device, a wearable device, and a vehicle system.

The controller 200 may control operation timings of a display panel driver at a frame frequency of (input frame frequency X i) Hz, which equals i times the input frame frequency, where "i" is a positive integer greater than 0. The input frame frequency is 60 Hz in the national television standards committee (NTSC) system, and may be 50 Hz in the phase-alternating line (PAL) system.

The controller 200 generates a signal so that the pixels P can be driven at various refresh rates. In other words, the controller 200 generates signals related to the driving so that the pixels P can be driven in a variable refresh rate (VRR) mode or switchable between a first refresh rate and a second refresh rate. For example, the controller 200 may drive the pixels P at various refresh rates by simply changing the rate of the clock signal, generating a synchronization signal to make a horizontal blank or a vertical blank, or driving the gate driver 300 in a mask method.

The controller 200 generates the gate control signal GCS for controlling the operation timing of the gate driver 300, and the data control signal DSC for controlling the operation timing of the data driver 400, based on the timing signals Vsync, Hsync, and DE received from the host system. The controller 200 control the operation timing of the display panel driver to synchronize the gate driver 300 and the data driver 400.

The voltage level of the gate control signal GCS output from the controller 200 is converted into a gate-on voltage VGL, VEL and a gate-off voltage VGH, VEH through a level shifter (not shown) and then supplied to the gate driver 300. The level shifter converts the low-level voltage of the gate control signal GCS into a gate low voltage VGL, and converts the high level voltage of the gate control signal GCS into a gate high voltage VGH. The gate control signal GCS includes a start pulse and a shift clock.

The gate driver 300 supplies the scan signal SC to the gate line GL based on the gate control signal GCS received from the controller 200. The gate driver 300 may be disposed at one side or opposite sides of the display panel 100 as a gate-in panel (GIP) type.

The gate driver 300 outputs the gate signals to the plurality of gate lines GL in sequence under the control of the controller 200. The gate driver 300 may shift the gate signal through a shift register, thereby sequentially supplying the signals to the gate lines GL.

The gate signal may include the scan signal SC and the emission control signal EM in the organic light-emitting display device. The scan signal SC includes a scan pulse that swings between the gate-on voltage VGL and the gate-off voltage VGH. The emission control signal EM may include an emission control signal pulse that swings between the gate-on voltage VEL and the gate-off voltage VEH.

The scan pulse is synchronized with the data voltage Vdata and selects the pixels P of a line in which data will be written. The emission control signal EM defines the emission time of the pixels P.

The gate driver 300 may include an emission control signal driver 310, and at least one scan driver 320.

The emission control signal driver 310 outputs the emission control signal pulse in response to a start pulse and a shift clock from the controller 200, and sequentially shifts the emission control signal pulses in response to the shift clocks.

The at least one scan driver 320 outputs the scan pulse in response to a start pulse and a shift clock from the controller 200, and shifts the scan pulse according to the shift clock timing.

The data driver 400 converts the image data RGB into the data voltage Vdata based on the data control signal DCS supplied from the controller 200, and supplies the converted data voltage Vdata to the pixels P through the data lines DL.

FIG. 1 illustrates that one data driver 400 is disposed at one side of the display panel 100, but there are no limits to the number and position of data drivers 400.

In other words, the data driver 400 may include a plurality of integrated circuits (IC) and be disposed as divided in plural at one side of the display panel 100.

The power supply 500 employs a DC-DC converter to generate DC power necessary for driving a pixel array and a display panel driver of the display panel 100. The DC-DC converter may include a charge pump, a regulator, a buck converter, a boost converter, etc. The power supply 500 receives a DC input voltage from the host system (not shown) and generate DC voltages such as the gate-on voltages VGL, VEL, the gate-off voltages VGH, VEH, the high-potential driving voltage EVDD, and the low-potential driving voltage EVSS. The gate-on voltage VGL, VEL and the gate-off voltages VGH, VEH are supplied to the level shifter (not shown) and the gate driver 300. The high-potential driving voltage EVDD, and the low-potential driving voltage EVSS are supplied to the pixels P in common.

FIG. 2 is a cross-sectional view showing a stacked structure of a display device according to an embodiment.

Referring to FIG. 2, the cross-sectional view shows two thin film transistors TFT1 and TFT2 and one capacitor CST. The two thin film transistors TFT1 and TFT2 includes a thin film transistor which is either a switching thin film transistor or a driving thin film transistor, which contains a polycrystalline semiconductor material, and a thin film transistor which contains an oxide semiconductor material. In this case, the thin film transistor containing the polycrystalline semiconductor material will be called a polycrystalline thin film transistor TFT1, and the thin film transistor containing the oxide semiconductor material will be called the oxide thin film transistor TFT2.

In FIG. 2, the polycrystalline thin film transistor TFT1 is a driving thin film transistor connected to the light emitting diode OLED, and the oxide thin film transistor TFT2 is any one of switching thin film transistors connected to the capacitor CST.

One pixel P includes the light emitting diode OLED, and the pixel driving circuit for applying a driving current to the light emitting diode OLED. The pixel driving circuit is disposed on a substrate 111, and the light emitting diode OLED is disposed on the pixel driving circuit. In addition, an encapsulation layer 120 is disposed on the light emitting diode OLED. The encapsulation layer 120 protects the light emitting diode OLED.

The pixel driving circuit may refer to an array for pixel driving circuit, which includes the driving thin film transistor, the switching thin film transistor, and the capacitor. In addition, the light emitting diode OLED may refer to an array for light emission, which includes the anode, the cathode, and the light emitting layer disposed between the anode and the cathode.

According to an embodiment, the driving thin film transistor and at least one switching thin film transistor employ an oxide semiconductor as an active layer. The thin film transistor using the oxide semiconductor material as the active layer has an excellent leakage-current blocking effect and a relatively low manufacturing cost, compared to the thin film transistor using the polycrystalline semiconductor material as the active layer. Therefore, to reduce power consumption and lower manufacturing costs, the pixel driving circuit according to an embodiment includes the driving thin film transistor and at least one switching thin film transistor, which employ the oxide semiconductor material.

All the thin film transistors of the pixel driving circuit may be implemented using the oxide semiconductor material, or only some switching thin film transistors may be implemented using the oxide semiconductor material.

However, the reliability of the thin film transistor using the oxide semiconductor material is difficult to secure, but the thin film transistor using the polycrystalline semiconductor material has fast operation speed and high reliability. Therefore, the pixel driving circuit according to an embodiment includes both the switching thin film transistor using the oxide semiconductor material and the witching thin film transistor using the polycrystalline semiconductor material.

The substrate 111 may be implemented as a multi-layer where an organic film and an inorganic film are alternately stacked. For example, an organic film of polyimide and an inorganic film of silicon oxide (SiO$_2$) may be alternately stacked to form the substrate 111.

A lower buffer layer 112a is formed on the substrate 111. The lower buffer layer 112a is to block permeation of moisture, etc. from the outside. The lower buffer layer 112a may be formed by stacking films of silicon oxide (SiO$_2$) or the like as a multi-layer. Further, an auxiliary buffer layer 112b may be additionally disposed on the lower buffer layer 112a to protect the elements from the permeation of moisture.

On the substrate 111, the polycrystalline thin film transistor TFT1 is formed. The polycrystalline thin film transistor TFT1 may employ a polycrystalline semiconductor as the active layer. The polycrystalline thin film transistor TFT1 includes a first active layer ACT which includes channels through which electrons or holes are transported, a first gate electrode GE1, a first source electrode SD1, and a first drain electrode SD2.

The first active layer ACT includes a first channel area, a first source area disposed on one side with respect to the first channel area, and a first drain area disposed on the other side.

The first source area and the first drain area refer to areas where an intrinsic polycrystalline semiconductor material is doped with pentavalent or trivalent impurity ions, for example, phosphorus (P) or boron (B), at predetermined concentrations to become conductive. The first channel area refers to an area where the polycrystalline semiconductor material remains intrinsic, thereby providing a pathway for transporting electrons or holes.

Meanwhile, the polycrystalline thin film transistor TFT1 includes the first gate electrode GE1 overlapping the first channel area of the first active layer ACT1. A first gate insulating layer 113 is disposed between the first gate electrode GE1 and the first active layer ACT1. The first gate insulating layer 113 may be formed by stacking a silicon oxide (SiO$_2$) film, a silicon nitride (SiNx) or the like inorganic layer as a single layer or multiple layers.

According to an embodiment, the polycrystalline thin film transistor TFT1 has a top gate structure where the first gate electrode GE1 is positioned above the first active layer ACT1. Thus, a first electrode CST1 included in the capacitor CST and a light shielding layer LS included in the oxide thin film transistor TFT2 may be formed of the same material as the first gate electrode GEL. The first gate electrode GE1, the first electrode CST1, and the light shielding layer LS are formed through one mask process, thereby reducing the mask process.

The first gate electrode GE1 is made of a metal material. For example, the first gate electrode GE1 may be a single or multiple layers made of any one among, but not limited to, molybdenum (Mo), aluminum (Al), chromium (Cr), gold (Au), titanium (Ti), nickel (Ni), neodymium (Nd) and copper (Cu) or alloys thereof.

A first interlayer insulating layer 114 is disposed on the first gate electrode GEL. The first interlayer insulating layer 114 may contain silicon oxide (SiO$_2$), silicon nitride (SiNx), etc.

The display panel 100 may further include an upper buffer layer 115, a second gate insulating layer 116, and a second interlayer insulating layer 117 which are disposed in sequence on the first interlayer insulating layer 114, and the polycrystalline thin film transistor TFT1 may be formed on the second interlayer insulating layer 117 and include the first source electrode SD1 and the first drain electrode SD2 respectively connected to the first source area and the first drain area.

Each of the first source electrode SD1 and the first drain electrode SD2 may be a single layer or multiple layers made of one among, but not limited to, molybdenum (Mo), aluminum (Al), chromium (Cr), gold (Au), titanium (Ti), nickel (Ni), neodymium (Nd), and copper (Cu), or alloys thereof.

The upper buffer layer 115 separates a second active layer ACT2 of the oxide thin film transistor TFT2 made of the oxide semiconductor material from the first active layer ACT1 made of the polycrystalline semiconductor material, and provides a base for forming the second active layer ACT2.

The second gate insulating layer 116 covers the second active layer ACT2 of the oxide thin film transistor TFT2. The second gate insulating layer 116 is made of an inorganic film because it is formed on the second active layer ACT2 made of the oxide semiconductor material. For example, the second gate insulating layer 116 may include silicon oxide (SiO$_2$), silicon nitride (SiNx), etc.

The second gate electrode GE2 is made of a metal material. For example, the second gate electrode GE2 may be a single layer or multiple layers made of one among, but not limited to, molybdenum (Mo), aluminum (Al), chromium (Cr), gold (Au), titanium (Ti), nickel (Ni), neodymium (Nd), and copper (Cu) or alloys thereof.

Meanwhile, the oxide thin film transistor TFT2 is formed on the upper buffer layer 115, and includes the second active layer ACT2 made of the oxide semiconductor material, the second gate electrode GE2 disposed on the second gate insulating layer 116, a second source electrode SD3 and a second drain electrode SD4 disposed on the second interlayer insulating layer 117.

The second active layer ACT2 includes an intrinsic second channel area made of the oxide semiconductor material and not doped with impurities, and the second source area and the second drain area doped with impurities to become conductive.

The oxide thin film transistor TFT2 further includes a light shielding layer LS disposed below the upper buffer layer 115 and overlapping the second active layer ACT2. The light shielding layer LS shields light incident on the second active layer ACT2 and secures the reliability of the oxide thin film transistor TFT2. The light shielding layer LS may be made of the same material as the first gate electrode GE1 and formed on the upper surface of the first gate insulating layer 113. The light shielding layer LS may be electrically connected to the second gate electrode GE2 and form a dual gate.

The second source electrode SD3 and the second drain electrode SD4, together with the first source electrode SD1 and the first drain electrode SD2, are simultaneously formed as the same material on the second interlayer insulating layer 117, thereby reducing the number of mask processes.

Meanwhile, the second electrode CST2 is disposed on the first interlayer insulating layer 114 to overlap the first electrode CST1, thereby forming the capacitor CST. The second electrode CST2 may be a single layer or multiple layers made of one among, for example, molybdenum (Mo), aluminum (Al), chromium (Cr), gold (Au), titanium (Ti), nickel (Ni), neodymium (Nd), and copper (Cu) or alloys thereof.

The capacitor CST stores the data voltage applied through the data lines DL for a certain period of time and provides the stored data voltage to the light emitting diode OLED. The capacitor CST includes two electrodes corresponding to each other and a dielectric disposed between the two electrodes. Between the first electrode CST1 and the second electrode CST2, the first interlayer insulating layer 114 is disposed.

The first electrode CST1 or the second electrode CST2 of the capacitor CST may be electrically connected to the second source electrode SD3 or the second drain electrode SD4 of the oxide thin film transistor TFT2. However, without limitation, such a connection in the capacitor may be varied depending on the pixel driving circuit.

Meanwhile, a first planarization layer 118 and a second planarization layer 119 are disposed in sequence on the pixel driving circuit to planarize the top of the pixel driving circuit. The first planarization layer 118 and the second planarization layer 119 may be an organic film such as polyimide or acryl resin.

In addition, the light emitting diode OLED is formed on the second planarization layer 119.

The light emitting diode OLED includes the anode ANO, the cathode CAT, and the emissive layer EL disposed between the anode ANO and the cathode CAT. When a pixel driving circuit is implemented to use a low potential voltage connected to the cathode CAT in common, the anode ANO is disposed as a separate electrode for each sub-pixel. On the other hand, when a pixel driving circuit is implemented to use a high potential voltage in common, the cathode CAT may be disposed as a separate electrode for each sub-pixel.

The light emitting diode OLED is electrically connected to the driving element through an intermediate electrode CNE disposed on the first planarization layer 118. Specifically, the anode ANO of the light emitting diode OLED and the first source electrode SD1 of the polycrystalline thin film transistor TFT1 forming the pixel driving circuit are connected to each other by the intermediate electrode CNE.

The anode ANO is connected to the intermediate electrode CNE exposed through a contact hole formed penetrating the second planarization layer 119. Further, the intermediate electrode CNE is connected to the first source electrode SD1 exposed through the contact hole formed penetrating the first planarization layer 118.

The intermediate electrode CNE serves as a medium connecting the first source electrode SD1 and the anode ANO. The intermediate electrode CNE may be formed of a conductive material such as copper (Cu), silver (Ag), molybdenum (Mo), and titanium (Ti).

The anode ANO may be formed as a multilayered structure that includes a transparent conductive film and an opaque conductive film having a high reflective efficiency. The transparent conductive film may be made of indium-tin-oxide (ITO), indium-zinc-oxide (IZO) or the like material having a relatively large work function, and the opaque conductive film may be structured to have a single layer or multiple layers made of aluminum (Al), silver (Ag), copper (Cu), lead (Pb), molybdenum (Mo), titanium (Ti) or alloys thereof. For example, the anode ANO may be formed to have a structure where the transparent conductive film, the opaque conductive film, and the transparent conductive film are stacked in sequence, or a structure where the transparent conductive film and the opaque conductive film are stacked in sequence.

The emissive layer EL is formed by stacking a hole-related layer, an organic light emitting layer, and an electron-related layer on the anode ANO in sequence or in reverse sequence.

A bank layer BNK may be a pixel defining layer that exposes the anode ANO of each pixel P. The bank layer BNK may be formed of an opaque material (e.g., black) to prevent optical interference between adjacent pixels P. In this case, the bank layer BNK may be made of a light blocking material that includes at least one of a color pigment, organic black, and carbon. A spacer may be further disposed on the bank layer BNK.

The cathode CAT is formed on the top and lateral surfaces of the emissive layer EL while facing the anode ANO with the emissive layer EL therebetween. The cathode CAT may be formed as a single body throughout the display area DA. When the cathode CAT is applied to an Front-emissive organic light emitting display device, the cathode CAT may be made of indium-tin-oxide (ITO), indium-zinc-oxide (IZO) or the like transparent conductive film.

On the cathode CAT, the encapsulation layer 120 may be further disposed to suppress permeation of moisture.

The encapsulation layer 120 prevents or at least reduces external water or oxygen from permeating the light-emitting diode OLED vulnerable to water or oxygen. To this end, the encapsulation layer 120 includes, but is not limited to, at least one inorganic encapsulation layer, and at least one organic encapsulation layer. According to the disclosure, it will be described by way of example that the encapsulation layer 120 has a structure where a first encapsulation layer 121, a second encapsulation layer 122, and a third encapsulation layer 123 are stacked in sequence.

The first encapsulation layer 121 is formed on the substrate 111 formed with the cathode CAT. The third encapsulation layer 123 is formed on the substrate 111 formed with the second encapsulation layer 122, and formed to, together with the first encapsulation layer 121, surround the top, bottom and lateral sides of the second encapsulation layer 122. The first encapsulation layer 121 and the third encapsulation layer 123 may reduce or prevent the permeation of external water or oxygen into the light-emitting diode OLED. The first encapsulation layer 121 and the third encapsulation layer 123 may be formed of inorganic insulating materials such as silicon nitride (SiNx), silicon oxide (SiOx), silicon oxynitride (SiON) or aluminum oxide ($Al_2O_3$) which can be deposited at a low temperature. Because the first encapsulation layer 121 and the third encapsulation layer 123 are deposited at a low temperature atmosphere, the light-emitting diode OLED vulnerable to high temperature atmosphere is prevented from being damaged when the first encapsulation layer 121 and the third encapsulation layer 123 are subjected to a deposition process.

The second encapsulation layer 122 serves as a buffer to relieve stress between the layers due to bending of the display device 10, and levels out a stepped portion between the layers. The second encapsulation layer 122 may be formed of a non-photosensitive inorganic insulating material such as acryl resin, epoxy resin, phenolic resin, polyamide resin, polyimide resin, polyethylene or silicon oxycarbide (SiOC), or a photosensitive inorganic insulating material such as photo-acryl on the substrate 111 formed with the first encapsulation layer 121, but not limited thereto. When the second encapsulation layer 122 is formed by an inkjet method, a dam DAM may be disposed to prevent the second encapsulation layer 122 in a liquid state from spreading over to the edges of the substrate 111. The dam DAM may be disposed closer to the edge of the substrate 111 than the second encapsulation layer 122. By the dam DAM, the second encapsulation layer 122 is prevented from spreading to a pad area where a conductive pad disposed at the outmost edge of the substrate 111 is disposed.

The dam DAM is designed to prevent the second encapsulation layer 122 from spreading. However, if the second encapsulation layer 122 is formed beyond the height of the dam DAM during the process, the organic layer, i.e., the second encapsulation layer 122 may be exposed to the outside so that water or the like can easily permeate into the light-emitting diode. Therefore, to prevent this, at least ten dams DAM may be formed to be duplicated.

The dam DAM may be disposed on the second interlayer insulating layer 117 of the non-display area NDA.

Further, the dam DAM may be formed simultaneously with the first planarization layer 118 and the second planarization layer 119. A lower layer of the dam DAM may be formed together when the first planarization layer 118 is formed, and an upper layer of the dam DAM may be formed together when the second planarization layer 119 is formed.

Therefore, the dam DAM may be made of the same material as the first planarization layer 118 and the second planarization layer 119, but not limited thereto.

The dam DAM may be formed overlapping a low-potential driving power line VSS. For example, the low-potential driving power line VSS may be formed as a layer under an area where the dam DAM is positioned within the non-display area NDA.

The low-potential driving power line VSS and the gate driver 300 formed as a gate in panel (GIP) may be formed to surround the periphery of the display panel, and the low-potential driving power line VSS may be positioned further outside than the gate driver 300. Further, the low-potential driving power line VSS is connected to the cathode CAT to supply a common voltage. The gate driver 300 is simply illustrated in the plan view and the cross-sectional view, but may be configured with the thin film transistor having the same structure as the thin film transistor of the display area DA.

The low-potential driving power line VSS is disposed further outside than the gate driver 300. The low-potential driving power line VSS is disposed outside the gate driver 300, and surrounds the display area DA. For example, the low-potential driving power line VSS may be made of the same material as the first gate electrode GE1, but not limited thereto. Alternatively. The low-potential driving power line VSS may be made of the same material as the second electrode CST2 or the first source and drain electrodes SD1 and SD2.

Further, the low-potential driving powerline VSS may be electrically connected to the cathode CAT. The low-potential driving power line VSS may supply a low-potential driving voltage EVSS to the plurality of pixels P within the display area DA.

A touch layer may be disposed on the encapsulation layer 120. In the touch layer, a touch buffer layer 151 may be positioned between the cathode CAT of the light-emitting diode OLED and a touch sensor metal including touch electrode connection lines 152 and 154 and touch electrodes 155 and 156.

The touch buffer layer 151 may block permeation of a chemical solution (e.g., a development solution or an etching solution) used in a process of fabricating the touch sensor metal disposed on the touch buffer layer 151, water from the outside, etc. into the light-emitting layer EL including the organic material. Thus, the touch buffer layer 151 prevents or at least reduces the light-emitting layer EL vulnerable to the chemical solution or water from being damaged.

The touch buffer layer 151 is formed of an organic insulating material, which can be formed at a low temperature below a certain temperature (e.g., 100 degrees Celsius (° C.)) and has a low dielectric constant of 1 to 3, to prevent the light-emitting layer EL including an organic material vulnerable to high temperature from being damaged. For example, the touch buffer layer 151 may be formed of an acrylic-based, epoxy-based, or siloxane-based material. The touch buffer layer 151, which is an organic insulating material and has planarization performance, may prevent the encapsulation layer 120 from being damaged and the touch sensor metal formed on the touch buffer layer 151 from being broken due to the bending of the organic light-emitting display device.

In the touch sensor structure based on mutual capacitance, the touch electrodes 155 and 156 may be disposed on the touch buffer layer 151, and the touch electrodes 155 and 156 may be disposed to intersect each other.

The touch electrode connection lines 152 and 154 may electrically connect the touch electrodes 155 and 156. The touch electrode connection lines 152 and 154 and the touch electrodes 155 and 156 may be positioned at different layers with a touch insulating film 153 therebetween.

The touch electrode connection lines 152 and 154 are disposed to overlap the bank layer BNK and prevent an aperture ratio from being lowered.

Meanwhile, in the touch electrodes 155 and 156, a part of the touch electrode connection line 152 may be electrically connected to a touch driving circuit (not shown) through a touch pad PAD via the top and lateral side of the encapsulation layer 120 and the top and lateral side of the dam DAM.

The part of the touch electrode connection line 152 may receive a touch driving signal from a touch driving circuit and transmit the touch driving signal to the touch electrodes 155 and 156, and may also transmit a touch sensing signal from the touch electrodes 155 and 156 to the touch driving circuit.

A touch protection film 157 may be disposed on the touch electrodes 155 and 156. In the accompanying drawings, the touch protection film 157 is disposed only the touch electrodes 155 and 156, but not limited thereto. Alternatively, the touch protection film 157 may also be disposed on the touch electrode connection line 152 as extended even to the front or rear of the dam DAM.

In addition, a color filter (not shown) may further be disposed on the encapsulation layer 120. Alternatively, the color filter may be positioned on the touch layer, or may also be positioned between the encapsulation layer 120 and the touch layer.

Figure 3:
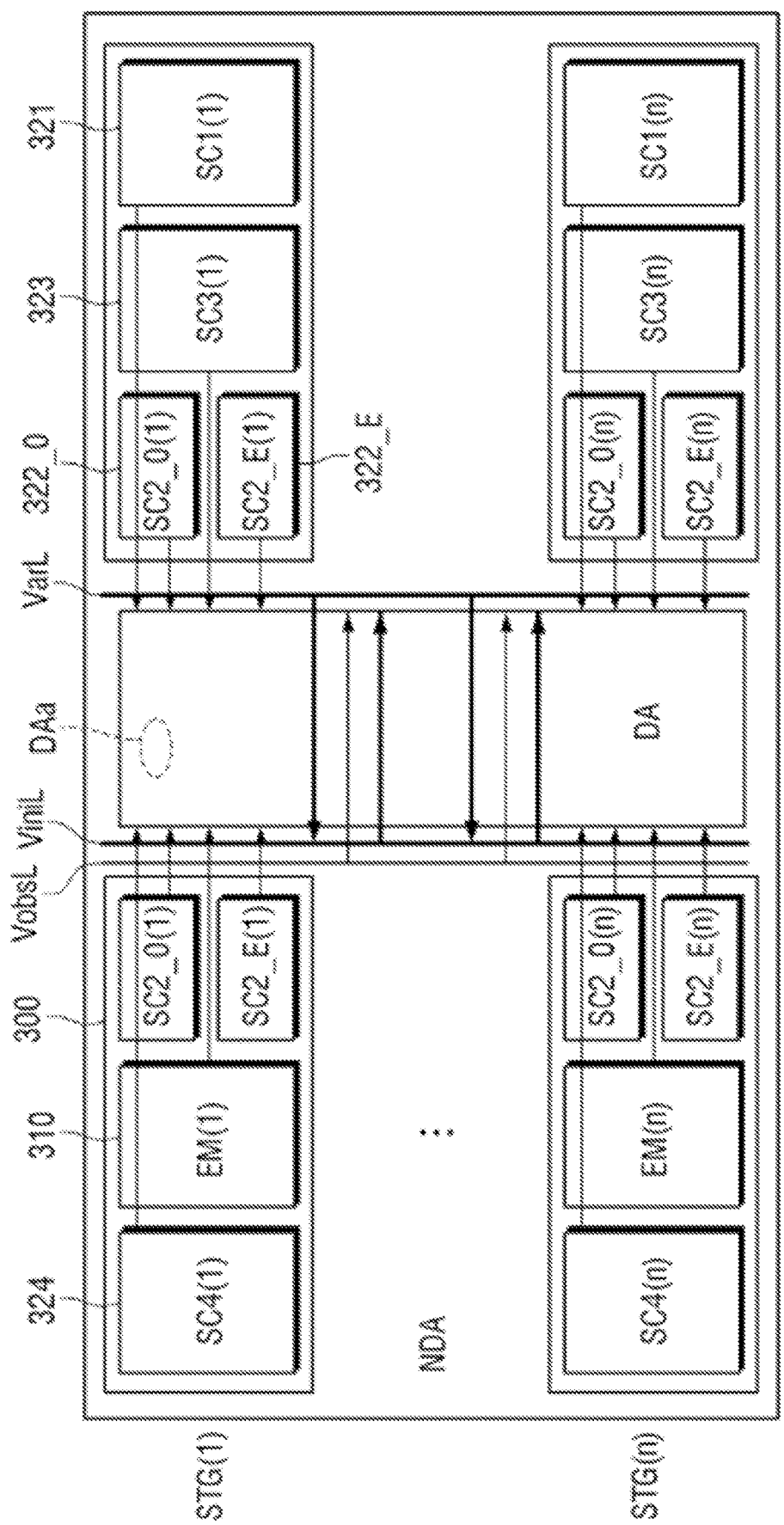
FIG. 3 is a diagram showing a configuration of a gate driver in a display device according to an embodiment.

FIG. 3 is a diagram showing a configuration of a gate driver in a display device according to an embodiment.

Referring to FIG. 3, the gate driver 300 includes the emission control signal driver 310, and the scan driver 320. The scan driver 320 may include first to fourth scan drivers 321, 322, 323 and 324. Further, the second scan driver 322 may include an odd-numbered second scan driver 322_O and the even-numbered second scan driver 322_E.

The gate driver 300 may include shift registers symmetrically provided at the opposite sides of the display area DA. Further, the gate driver 300 may be configured such that the shift register at one side of the display area DA includes a second scan drivers 322_O and 322_E, a fourth scan driver 324, and the emission control signal driver 310, and the shift register at the other side of the display area DA includes a first scan driver 321, the second scan drivers 322_O and 322_E, and the third scan driver 323. However, without limitation, the emission control signal driver 310 and the first to fourth scan drivers 321, 322, 323 and 324 may be arranged variously according to embodiments.

Each of stages STG1 to STGn of the shift register may include first scan signal generators SC1(1) to SC1(n), second scan signal generators SC2_O(1) to SC2_O(n) and SC2_E(1) to SC2_E(n), third scan signal generators SC3(1) to SC3(n), fourth scan signal generators SC4(1) to SC4(n), and emission control signal generators EM(1) to EM(n).

The first scan signal generators SC1(1) to SC1(n) output first scan signals SC1(1) to SC1(n) through the first scan lines SCL1 of the display panel 100. The second scan signal generators SC2(1) to SC2(n) output second scan signals SC2(1) to SC2(n) through the second scan lines SCL2 of the display panel 100. The third scan signal generators SC3(1) to SC3(n) output third scan signals SC3(1) to SC3(n) through third scan lines SCL3 of the display panel 100. The fourth scan signal generators SC4(1) to SC4(n) output fourth scan signals SC4(1) to SC4(n) through the fourth scan lines SCL4 of the display panel 100. The emission control signal generators EM(1) to EM(n) output emission control signals EM(1) to EM(n) through the emission control lines EML of the display panel 100.

The first scan signals SC1(1) to SC1(n) may be used as signals for driving an A transistor (for example, a compensation transistor, etc.) included in the pixel circuit. The second scan signals SC2(1) to SC2(n) may be used as signals for driving a B transistor (for example, a data supplying transistor, etc.) included in the pixel circuit. The third scan signals SC3(1) to SC3(n) may be used as signals for driving a C transistor (for example, a bias transistor, etc.) included in the pixel circuit. The fourth scan signals SC4(1) to SC4(n) may be used as signals for driving a D transistor (for example, an initialization transistor, etc.) included in the pixel circuit. The emission control signals EM(1) to EM(n) may be used as signals for driving an E transistor (for example, an emission control transistor, etc.) included in the pixel circuit. For example, when the emission control signals EM(1) to EM(n) are used to control the emission control transistor of the pixels, the light emission time of the light emitting diode is changed.

Referring to FIG. 3, a bias voltage bus line VobsL, a first initialization voltage bus line VarL, and a second initialization voltage bus line ViniL may be disposed between the gate driver 300 and the display area DA.

The bias voltage bus line VobsL, the first initialization voltage bus line VarL, and the second initialization voltage bus line ViniL may be used to supply the bias voltage Vobs, the first initialization voltage Var, and the second initialization voltage Vini from the power supply 500 to the pixel circuit.

FIG. 3 illustrates that the bias voltage bus line VobsL, the first initialization voltage bus line VarL, and the second initialization voltage bus line ViniL are located on, but not limited thereto, only the left or right side of the display area DA, but may be located on both sides. Although they are located on one side, there are no limits to their location on the left or right side.

Referring to FIG. 3, one or more optical areas DAa (including DA1 or DA2 in FIGS. 6A to 6D) may be disposed in the display area DA.

One or more optical areas DAa may be arranged to overlap an imaging device such as a camera (or an image sensor), a detection sensor such as a proximity sensor and an illumination sensor, or the like one or more optical electronic devices.

One or more optical areas DAa may have a light transmission structure with a transmittance higher than or equal to a certain level to operate the optical electronic device. In other words, the number of pixels P per unit area in one or more optical areas DAa may be smaller than the number of pixels P per unit area in a normal area excluding the optical areas DAa from the display area DA. In other words, one or more optical areas DAa may have a lower resolution than the normal area of the display area DA.

In one or more optical areas DAa, the light transmission structure may be formed by patterning the cathode in a portion where no pixels P are arranged. In this case, the cathode may be patterned using a laser, or a cathode deposition preventing layer or the like material may be used to selectively form and pattern the cathode.

Further, in one or more optical areas DAa, the light transmission structure may be formed by separately forming the light emitting diode OLED and the pixel circuit in the pixel P. In other words, the light emitting diode OLED of the pixel P may be located on the optical areas DAa, and a plurality of transistors TFT forming the pixel circuit may be disposed on the periphery of the optical areas DAa such that the light emitting diode OLED and the pixel circuit are electrically connected through a transparent metal layer. The optical areas DAa will be described later in detail with reference to FIG. 6.

Figure 4:
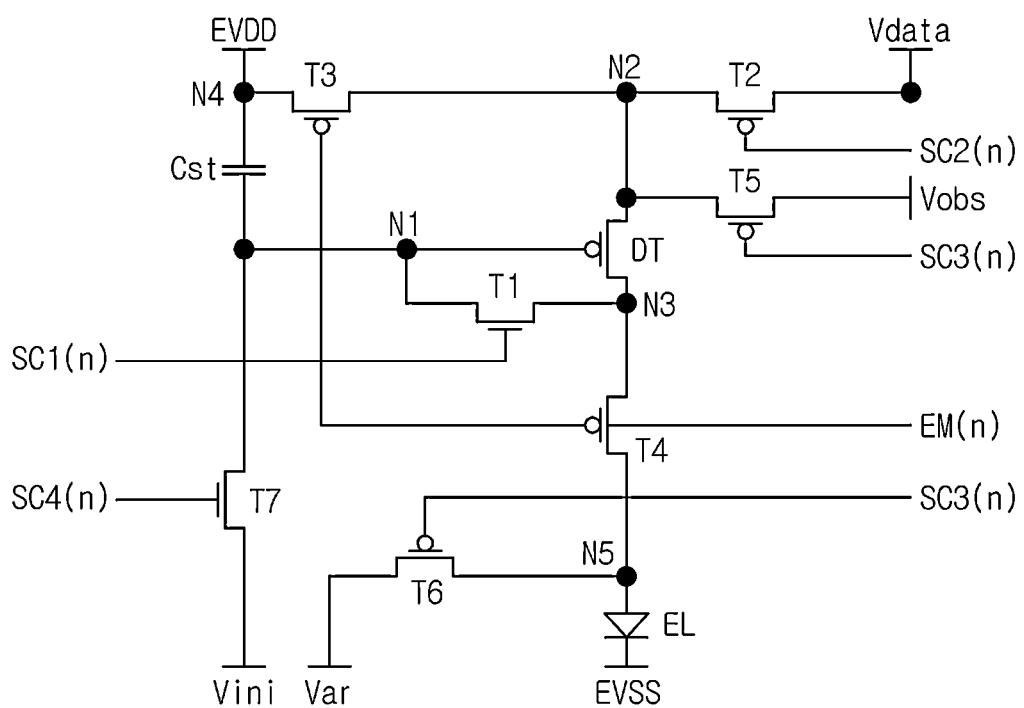
FIG. 4 is a diagram of a pixel circuit in a display device according to an embodiment.

FIG. 4 is a diagram of a pixel circuit in a display device according to an embodiment.

FIG. 4 shows a pixel circuit for illustrative purposes only, and its structure is not limited as long as an emission signal EM(n) is applied to control the emission of the light emitting diode OLED. For example, the pixel circuit may include an additional scan signal line, a switching thin film transistor connected to the additional scan signal line, and a switching thin film transistor to which an additional initialization voltage is applied, in which various connection relationships of a switching element or various connection positions of a capacitor are possible. Below, for convenience of description, a display device with the pixel circuit structure of FIG. 4 will be described.

Referring to FIG. 4, each of the plurality of pixels P may include a pixel circuit having a driving transistor DT, and a light emitting diode OLED connected to the pixel circuit.

The pixel circuit may drive the light emitting diode OLED by controlling a driving current flowing in the light emitting diode OLED. The pixel circuit may include the driving transistor DT, the first to seventh transistors T1 to T7, and a capacitor Cst. Each of the transistors DT, T1 to T7 may include a first electrode, a second electrode, and a gate electrode. One of the first electrode and the second electrode may be a source electrode, and the other one of the first electrode and the second electrode may be a drain electrode.

Each of the transistors DT, T1 to T7 may be a P-type thin film transistor or an N type thin film transistor. In the embodiment of FIG. 3, the first transistor T1 and the seventh transistor T7 are the N type thin film transistors, and the other transistors DT, T2 to T6 are the P type thin film transistor. However, without limitation, all or some of the transistors DT, T1 to T7 according to an embodiment may be the P type thin film transistor or the N type thin film transistor. Further, the N type thin film transistor may be an oxide thin film transistor, and the P type thin film transistor may be a polycrystalline silicon thin film transistor.

Below, descriptions will be made under the condition that the first transistor T1 and the seventh transistor T7 are the N type thin film transistor, and the other transistors DT, T2 to T6 are the P type thin film transistor. Therefore, the first transistor T1 and the seventh transistor T7 are turned on by a high voltage, and the other transistors DT, T2 to T6 are turned on by a low voltage.

For example, the first transistor T1 of the pixel circuit may function as a compensation transistor, the second transistor T2 may function as a data supply transistor, the third and fourth transistors T3 and T4 may function as an emission control transistor, the fifth transistor T5 may function as a bias transistor, and the sixth and seventh transistors T6 and T7 may function as an initialization transistor.

The light emitting diode OLED may include an anode and a cathode. The anode of the light emitting diode OLED may be connected to a fifth node N5, and the cathode may be connected to a low-potential driving voltage EVSS.

The driving transistor DT may include a first electrode connected to a second node N2, a second electrode connected to a third node N3, and a gate electrode connected to the first node N1. The driving transistor DT may provide a driving current Id to the light emitting diode OLED based on the voltage of the first node N1 (or a data voltage stored in the capacitor Cst (to be described later)).

The first transistor T1 may include a first electrode connected to the first node N1, a second electrode connected to the third node N3, and a gate electrode receiving the first scan signal SC1($n$). The first transistor T1 is turned on in response to the first scan signal SC1($n$), and diode-connected between the first node N1 and the third node N3, thereby sampling a threshold voltage Vth of the driving transistor DT. The first transistor T1 may be the compensation transistor.

The capacitor Cst may be connected or formed between the first node N1 and a fourth node N4. The capacitor Cst may store or maintain the high-potential driving voltage EVDD.

The second transistor T2 may include a first electrode connected to the data lines DL (or receiving the data voltage Vdata), a second electrode connected to the second node N2, and a gate electrode receiving the second scan signal SC2($n$). The second transistor T2 may be turned on in response to the second scan signal SC2($n$), and transmit the data voltage Vdata to the second node N2. The second transistor T2 may be the data supply transistor.

The third transistor T3 and the fourth transistor T4 (or the first and second emission control transistors) may be connected between the high-potential driving voltage EVDD and the light emitting diode OLED, and form a current moving pathway through which the driving current Id generated by the driving transistor DT moves.

The third transistor T3 may include a first electrode connected to the fourth node N4 and receiving the high-potential driving voltage EVDD, a second electrode connected to the second node N2, and a gate electrode receiving the emission control signal EM(n).

The fourth transistor T4 may include a first electrode connected to the third node N3, a second electrode connected to the fifth node N5 (or the anode of the light emitting diode OLED), and a gate electrode receiving the emission control signal EM(n).

The third and fourth transistors T3 and T4 are turned on in response to the emission control signal EM(n), and in this case, the driving current Id is provided to the light emitting diode OLED, so that the light emitting diode OLED can emit light with brightness corresponding to the driving current Id.

The fifth transistor T5 may include a first electrode receiving the bias voltage Vobs, a second electrode connected to the second node N2, and a gate electrode receiving the third scan signal SC3($n$). The fifth transistor T5 may be the bias transistor.

The sixth transistor T6 may include a first electrode receiving the first initialization voltage Var, a second electrode connected to the fifth node N5, and a gate electrode receiving the third scan signal SC3($n$).

The sixth transistor T6 may be turned on in response to the third scan signal SC3($n$) before the light emitting diode OLED emits light (or after the light emitting diode OLED emits light), and initialize the anode (or the pixel electrode) of the light emitting diode OLED based on the first initialization voltage Var. The light emitting diode OLED may include a parasitic capacitor formed between the anode and the cathode. While the light emitting diode OLED is emitting light, the parasitic capacitor may be charged and a specific voltage may be applied to the anode of the light emitting diode OLED. Therefore, the first initialization voltage Var is applied to the anode of the light emitting diode OLED through the sixth transistor T6, thereby initializing the amount of charges accumulated in the light emitting diode OLED.

In this disclosure, the gate electrodes of the fifth and sixth transistors T5 and T6 are configured to receive the third scan signal SC3($n$) in common. However, without limitation, the gate electrodes of the fifth and sixth transistors T5 and T6 may be configured to receive separate scan signals and be controlled independently of each other.

The seventh transistor T7 may include a first electrode receiving the second initialization voltage Vini, a second electrode connected to the first node N1, and a gate electrode receiving the fourth scan signal SC4($n$).

The seventh transistor T7 is turned on in response to the fourth scan signal SC4($n$), and initializes the gate electrode of the driving transistor DT by the second initialization voltage Vini. The gate electrode of the driving transistor DT may retain unnecessary charges due to the high-potential driving voltage EVDD stored in the capacitor Cst. Therefore, the second initialization voltage Vini is applied to the gate electrode of the driving transistor DT through the seventh transistor T7, thereby initializing the amount of remaining charges.

Figure 5A:
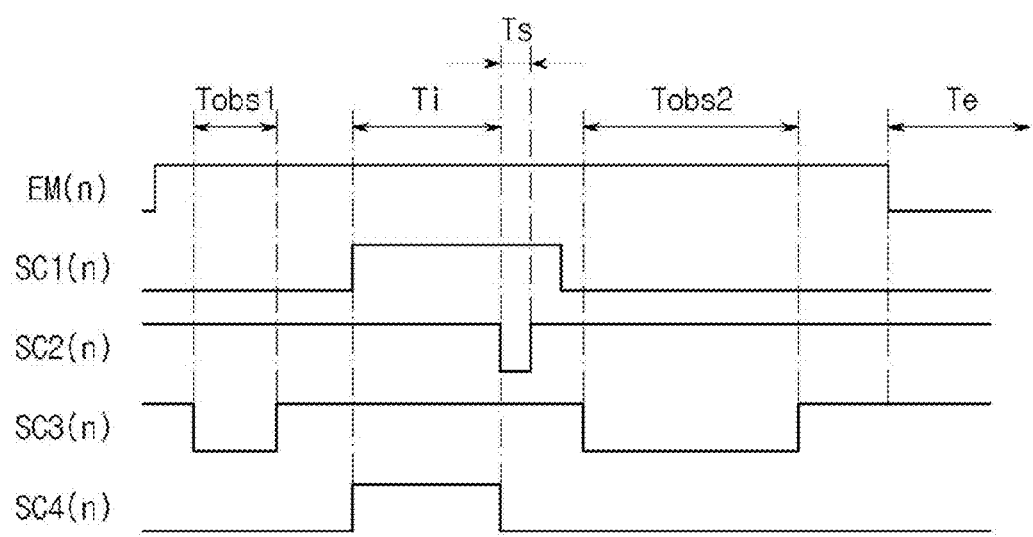
FIGS. 5A to 5C are views showing operations of a scan signal and an emission control signal in the pixel circuit shown in FIG. 4 during a refresh period and a hold period according to an embodiment.
Figure 5B:
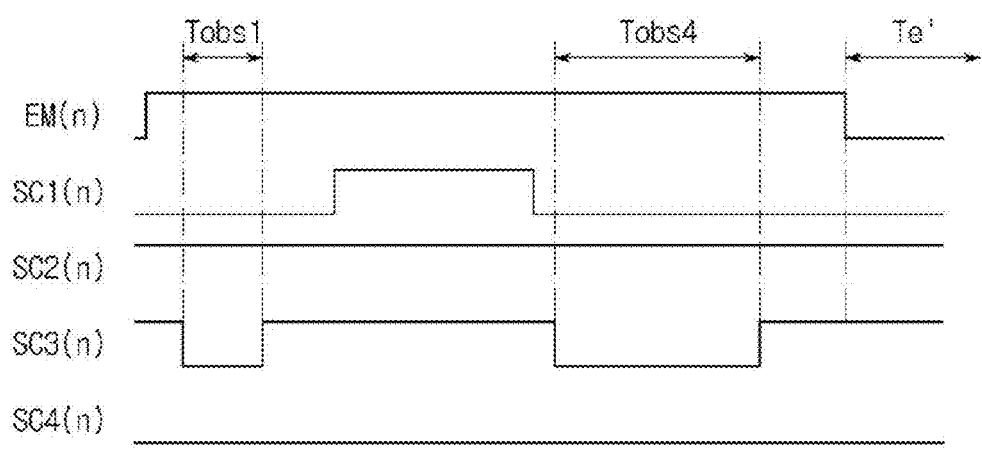
Figure 5C:
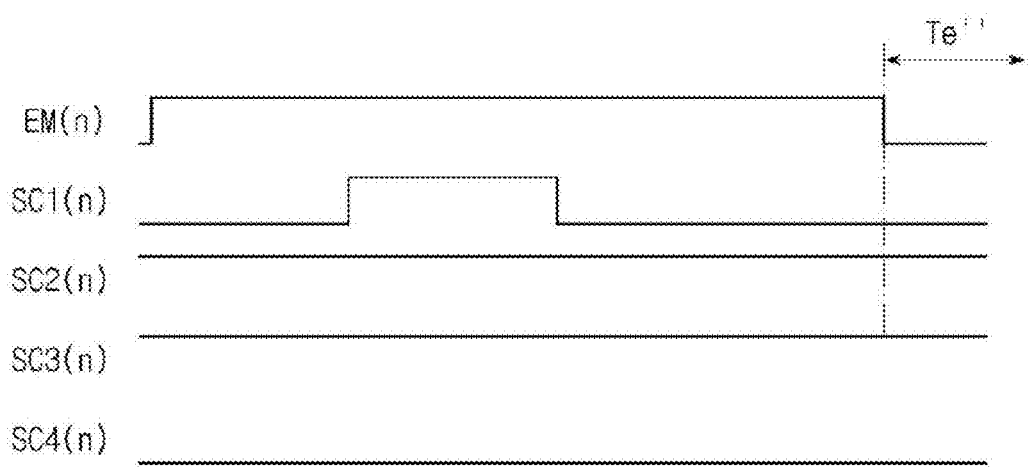

FIGS. 5A to 5C are views showing operations of a scan signal and an emission control signal in the pixel circuit shown in FIG. 4 during a refresh period and a hold period according to one embodiment.

According to an embodiment, the display device may operate in a variable refresh rate (VRR) mode. In the VRR mode, the pixels may operate at a constant frequency, operate by increasing the refresh rate for updating the data voltage Vdata at a point in time when high speed driving is required, or operate by decreasing the refresh rate at a point in time when low power consumption or low speed driving is required.

Each of the plurality of pixels P may be driven by a combination of a refresh frame and a hold frame within one second. In this disclosure, one set is defined as a combination of a refresh period during which the data voltage Vdata is updated and a hold period during which the data voltage Vdata is not updated is repeated for one second. In addition, the period of one set is a cycle in which the combination of the refresh period and the hold period is repeated.

In the case of a refresh rate of 120 Hz, only the refresh period is used. In other words, 120 refresh periods are arranged within one second. In this case, one refresh period is 1/120=8.33 ms, and the period of one set is also 8.33 ms.

In the case of a refresh rate of 60 Hz, the refresh period and the hold period are alternately used. In other words, 60 refresh periods and 60 hold periods are alternately arranged within one second. In this case, each of one refresh period and one hold period is 0.5/60=8.33 ms, and the period of one set is 16.66 ms.

In the case of a refresh rate of 1 Hz, one frame may be driven with one refresh period and 119 hold periods following the one refresh period. Further, in the case of a refresh rate of 1 Hz, one frame may be driven with a plurality of refresh periods and a plurality of hold periods. In this case, each of one refresh period and one hold period is 1/120=8.33 ms, and the period of one set is 1 s.

During the refresh period, a new data voltage Vdata is charged and thus applied to the driving transistor DT. On the other hand, during the hold period, data voltage Vdata of a previous frame is retained as it is and used. Meanwhile, the hold period is also referred to as a skip period in the sense that a process of applying the new data voltage Vdata to the driving transistor DT is omitted.

Each of the plurality of pixels P may initialize the voltage charged or retained in the pixel circuit during the refresh period. Specifically, during the refresh period, each of the plurality of pixels P may remove the influence of the data voltage Vdata and the high-potential driving voltage EVDD stored in the previous frame. Therefore, during the hold period, each of the plurality of pixels P may display an image corresponding to the new data voltage Vdata.

During the hold period, each of the plurality of pixels P may provide a driving current corresponding to the data voltage Vdata to the light emitting diode OLED, thereby displaying an image and maintaining the light emitting diode OLED turned on.

First, it will be described with reference to FIG. 5A that the pixel circuit and the light emitting diode are driven during the refresh period. The refresh period may include at least one bias section Tobs1, Tobs2, an initialization section T1, a sampling section Ts, and a light-emitting section Te. This is merely an embodiment, and there are no limits to the foregoing order of sections.

Referring to FIG. 5A, the pixel circuit may operate during the refresh period including at least one bias section Tobs1, Tobs2.

The at least one bias section Tobs1, Tobs2 refers to a section where an on-bias stress (OBS) operation for applying a bias voltage Vobs is performed, the emission control signal EM(n) is a high voltage, and the third and fourth transistors T3 and T4 are turned off. The first scan signal SC1(n) and the fourth scan signal SC4(n) are low voltages, and the first transistors T1 and the seventh transistor T7 are turned off. The second scan signal SC2 is a high voltage, and the second transistor T2 is turned off.

The third scan signal SC3(n) is input to have the low voltage, and the fifth and sixth transistors T5 and T6 are turned on. As the fifth transistor T5 is turned on, the bias voltage Vobs is applied to the first electrode of the driving transistor DT connected to the second node N2.

Here, the bias voltage Vobs is supplied to the drain electrode, i.e., the third node N3 of the driving transistor DT, thereby decreasing a charging time or charging delay of voltage in the fifth node N5, i.e., the anode of the light emitting diode OLED during the emission period. The driving transistor DT maintains a stronger saturation state.

For example, as the bias voltage Vobs increases, the voltage at the third node N3, i.e., the drain electrode of the driving transistor DT may increase but the gate-source voltage or the drain-source voltage of the driving transistor DT may decrease. Therefore, the bias voltage Vobs may be at least greater than the data voltage Vdata.

In this case, the level of the drain-source current Id flowing in the driving transistor DT may be decreased, and the stress of the driving transistor DT may be decreased under a positive bias stress condition, thereby eliminating the charging delay of the voltage at the third node N3. In other words, the on-bias stress (OBS) operation is performed before sampling the threshold voltage Vth of the driving transistor DT, thereby alleviating the hysteresis of the driving transistor DT.

Therefore, the on-bias stress (OBS) operation in the at least one bias section Tobs1, Tobs2 may be defined as an operation of directly applying a suitable bias voltage to the driving transistor DT during the non-emission periods.

Further, the sixth transistor T6 is turned on in the at least one bias section Tobs1, Tobs2, and thus the anode (or the pixel electrode) of the light emitting diode OLED connected to the fifth node N5 is initialized with the first initialization voltage Var.

However, the gate electrodes of the fifth and sixth transistors T5 and T6 may be configured to be controlled independently of each other by receiving separate scan signals. In other words, it is not necessary to simultaneously apply the bias voltage to the first electrode of the driving transistor DT and the anode of the light emitting diode OLED during the bias section.

Referring to FIG. 5A, the pixel circuit may operate during the refresh period including the initialization section T1. The initialization section T1 refers to a section for initializing the voltage of the gate electrode of the driving transistor DT.

The first to fourth scan signals SC1(n) to SC4(n) and the emission control signal EM(n) are high voltages, and the first transistor T1 and the seventh transistor T7 are turned on. The second to sixth transistors T2, T3, T4, T5 and T6 are turned off. As the first and seventh transistors T1 and T7 are turned on, the gate electrode and the second electrode of the driving transistor DT connected to the first node N1 are initialized with a second initialization voltage Vini.

Referring to FIG. 5A, the pixel circuit may operate during the refresh period including the sampling section Ts. The sampling section refers to a section for sampling the threshold voltage Vth of the driving transistor DT.

The first scan signal SC1(n), the third scan signal SC3(n), and the emission control signal EM(n) are high voltages, and the second scan signal SC2(n) and the fourth scan signal SC4(n) are low voltages. Thus, the third to seventh transistors T3, T4, T5, T6 and T7 are turned off, the first transistor T1 is maintained turned on, and the second transistor T2 is turned on. In other words, the second transistor T2 is turned on to apply the data voltage Vdata to the driving transistor DT, and the first transistor T1 is diode-connected between the first node N1 and the third node N3 to sample the threshold voltage Vth of the driving transistor DT.

Referring to FIG. 5A, the pixel circuit may operate during the refresh period including the light-emitting section Te. The light-emitting section Te refers to a section of offsetting the sampled threshold voltage Vth and making the light emitting diode OLED emit light with the driving current corresponding to the sampled data voltage.

The emission control signal EM(n) is a low voltage, and the third and fourth transistors T3 and T4 are turned on.

As the third transistor T3 is turned on, the high-potential driving voltage EVDD applied to the fourth node N4 is applied to the first electrode of the driving transistor DT connected to the second node N2 through the third transistor T3. The driving current Id flowing from the driving transistor DT to the light emitting diode OLED via the fourth transistor T4 is independent of the level of the threshold voltage Vth of the driving transistor DT to compensate for the threshold voltage Vth of the driving transistor DT.

Next, referring to FIG. 5B, during the hold period, the pixel circuit and the light emitting diode operate as follows.

The hold period may include at least one bias section Tobs3, Tobs4 and the light-emitting section Te'. Repetitive descriptions to the same operations of the pixel circuit during the hold period as those during the refresh period will be avoided.

The hold period is different from the refresh period in that new data voltage Vdata is charged and applied to the gate electrode of the driving transistor DT during the refresh period as described above but the data voltage Vdata of the refresh period is maintained and used during the hold period. Therefore, the hold period does not include the initialization section T1 and the sampling section Ts unlike the refresh period.

In the operations of the hold period, only one on-bias stress (OBS) operation may be sufficient. However, in this embodiment, for the convenience of the driving circuit, the third scan signal SC3($n$) in the hold period is driven like the third scan signal SC3($n$) in the refresh period, and thus the on-bias stress (OBS) operation in the hold period may be performed twice as in the refresh period.

A difference in the driving signal between the refresh period of FIG. 5A and the hold period of FIG. 5B is the second and fourth scan signals SC2($n$) and SC4($n$). Because the initialization section T1 and the sampling section Ts are not necessary during the hold period, the second scan signal SC2($n$) is always a high voltage and the fourth scan signal SC4($n$) is always a low voltage unlike those during the refresh period. In other words, the second and seventh transistors T2 and T7 are always turned off.

FIG. 5C illustrates the operations of the light emitting diode and the pixel circuit without performing the on-bias stress (OBS) operation during the hold period of FIG. 5B.

Referring to FIG. 5C, the pixel circuit may operate during the hold period including only a light-emitting section Te". In other words, the pixel circuit does not perform the on-bias stress (OBS) operation during the hold period, and the second scan signal SC2($n$) and the third scan signal SC3($n$) are always high voltages and the fourth scan signal SC4($n$) is always a low voltage. In other words, the second transistor T2 and the fifth to seventh transistors T5, T6 and T7 are always turned off.

FIGS. 6A to 6D are schematic plan views of a display device according to an embodiment.

Referring to FIGS. 6A to 6D, the display device 10 according to an embodiment of the disclosure may include the display panel 100 for displaying an image, and one or more optical electronic devices 170, 170a and 170b. The optical electronic devices 170, 170a and 170b may include a camera, a sensor, and the like light receiving device that receives light.

The display panel 100 refers to a panel for displaying an image to a user.

The display panel 100 may include a display element for displaying an image, a driving element for driving the display element, and wiring through which various signals are transmitted to the display element and the driving element. The display element may be differently defined according to the types of the display panel 100. For example, when the display panel 100 is an organic light-emitting display panel, the display element may be an organic light emitting diode that include an anode, a light emitting layer, and a cathode. For example, when the display panel 100 is a liquid crystal display panel, the display element may be a liquid crystal display element.

Below, it will be assumed that the display panel 100 is the organic light-emitting display panel. However, the display panel 100 is not limited to the organic light-emitting display panel.

Meanwhile, the display panel 100 may include a substrate, a plurality of insulating films on the substrate, a transistor layer, a light-emitting diode layer, etc. The display panel 100 may include a plurality of sub-pixels for displaying an image, and various signal lines for driving the plurality of sub-pixels. The signal lines may include a plurality of data lines, a plurality of gate lines, and a plurality of power lines, etc. In this case, each of the plurality of sub-pixels may include a transistor located in a transistor layer, and a light emitting diode located in a light emitting diode layer.

The display panel 100 may include a display area DA and a non-display area NDA.

The display area DA refers to an area of the display panel 100, in which an image is displayed.

A plurality of sub-pixels forming the plurality of pixels, and a circuit for driving the plurality of sub-pixels may be disposed in the display area DA. The plurality of sub-pixels refer to the minimum units that constitute the display area DA. The display element may be disposed in each of the plurality of sub-pixels, and the plurality of sub-pixels may constitute a pixel. For example, the organic light emitting diode that includes the anode, the light emitting layer, and the cathode may be disposed in each of the plurality of sub-pixels, but not limited thereto. Further, the circuit for driving the plurality of sub-pixels may include the driving element, the wiring, etc. For example, the circuit may include, but is not limited to, a thin film transistor, a storage capacitor, a gate line, a data line, etc.

The non-display area NDA refers to an area where no images are displayed.

The non-display area NDA may be bent not to be seen from the front thereof or may be obscured by a casing (not shown), which is also referred to as a bezel area.

FIGS. 6A to 6D illustrate that the non-display area NDA surrounds the display area DA having a rectangular shape. However, the shape and arrangement of the display area DA and the non-display area NDA are not limited to the examples shown in FIGS. 6A to 6D. In other words, the display area DA and the non-display area NDA may have any shape suitable for the design of an electronic apparatus with the display device 10. For example, the display area DA may have a pentagonal, hexagonal, circular, oval or the like shape.

In the non-display area NDA, various wirings and circuits may be disposed to drive the organic light emitting diode of the display area DA. For example, without limitation, link wirings, gate-in-panel wirings, a driving IC such as a gate driver IC and a data driver IC, and the like for transmitting signals to the plurality of sub-pixels and circuits of the display area DA may be disposed in the non-display area NDA.

The display device 10 may further include various additional elements for generating various signals or driving the pixels in the display area DA. The additional elements for driving the pixels may include an inverter circuit, a multiplexer, an electrostatic discharge circuit, etc. The display device 10 may also include the additional elements related to other functions other than the functions for driving the pixels. For example, the display device 10 may further include the additional elements for a touch detection function, a user authentication function (e.g., a fingerprint recognition), a multilevel pressure sensing function, a tactile feedback function, etc. The foregoing additional elements may be located in the non-display area NDA and/or an external circuit connected to a connection interface.

Referring to FIGS. 6A to 6D, the display area DA may include, but is not limited to, a first optical area DA1 and a second optical area DA2.

In FIGS. 6A to 6D, one or more optical electronic devices 170, 170a and 170b are electronic components located underneath the display panel 100 (on an opposite side to a viewing side).

Light may enter the front (or viewing side) of the display panel 100, pass through the display panel 100, and reach one or more optical electronic devices 170, 170a and 170b located underneath the display panel 100 (on the opposite side to the viewing side).

One or more optical electronic devices 170, 170a and 170b may be devices that receive the light transmitted through the display panel 100 and perform predetermined functions based on the received light.

For example, the optical electronic devices 170, 170a and 170b may include one or more among a camera, a proximity sensor, etc.

As described above, the optical electronic devices 170, 170a and 170b may be located underneath the display panel 100 even though they are required to receive light. In other words, the optical electronic devices 170, 170a and 170b may be located on the opposite side to the viewing side of the display panel 100. The optical electronic devices 170, 170a and 170b are not exposed to the front side of the display device 10. Therefore, the optical electronic devices 170, 170a and 170b are not seen when a user views the front of the display device 10.

For example, the camera located underneath the display panel 100 may be a front camera that captures images of the front, and may be regarded as a camera lens.

The optical electronic devices 170, 170a and 170b may be disposed to overlap the display area DA of the display panel 100. In other words, the optical electronic devices 170, 170a and 170b may be located within the display area DA.

Referring to FIGS. 6A to 6D, the display area DA may include a normal area NA and one or more optical areas DA1 and DA2.

One or more optical areas DA1 and DA2 may refer to areas that overlap one or more optical electronic devices 170, 170a and 170b.

Figure 6A:
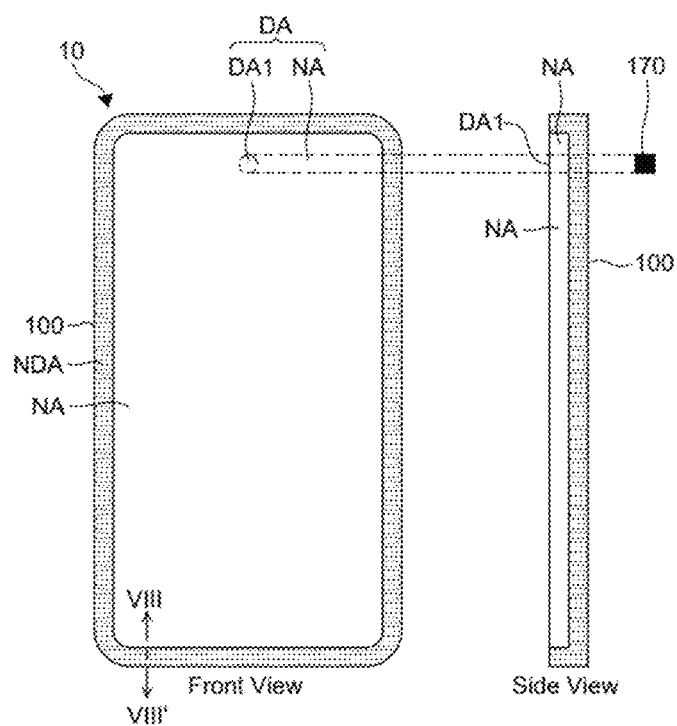
FIGS. 6A to 6D are schematic plan views of a display device according to an embodiment.

In the example shown in FIG. 6A, the display area DA may include the normal area NA and the first optical area DA1. Here, the first optical area DA1 may at least partially overlap the first optical electronic device 170.

FIG. 6A shows a structure that the first optical area DA1 has a circular shape. However, the shape of the first optical area DA1 according to an embodiment is not limited to that shown in FIG. 6A.

Figure 6B:
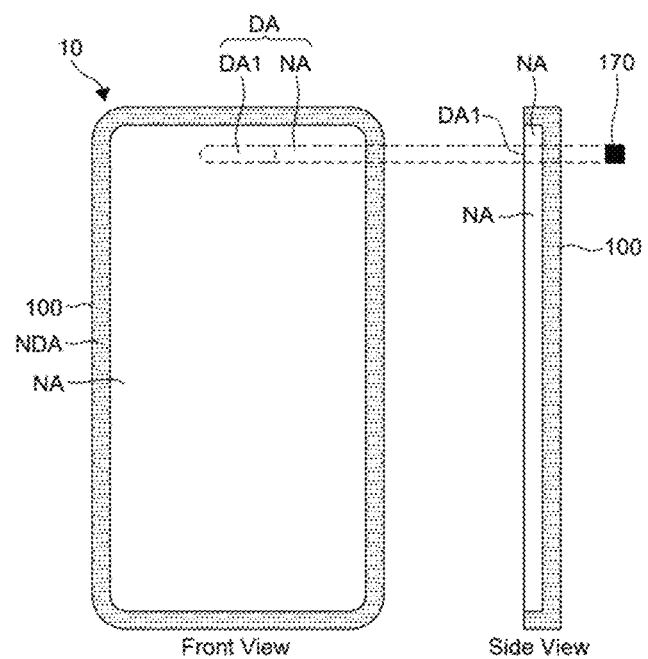

For example, as shown in FIG. 6B, the first optical area DA1 may have an octagonal shape, but may have various other polygonal shapes.

Figure 6C:
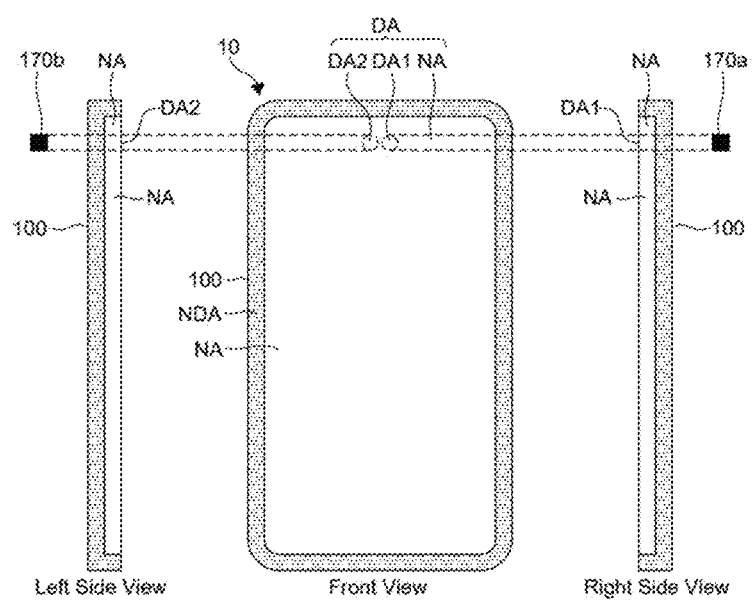

In the example shown in FIG. 6C, the display area DA may include the normal area NA, the first optical area DA1, and the second optical area DA2. In the example shown in FIG. 6C, the normal area NA may be present between the first optical area DA1 and the second optical area DA2. Here, the first optical area DA1 may at least partially overlap the first optical electronic device 170a, and the second optical area DA2 may at least partially overlap the second optical electronic device 170b.

Figure 6D:
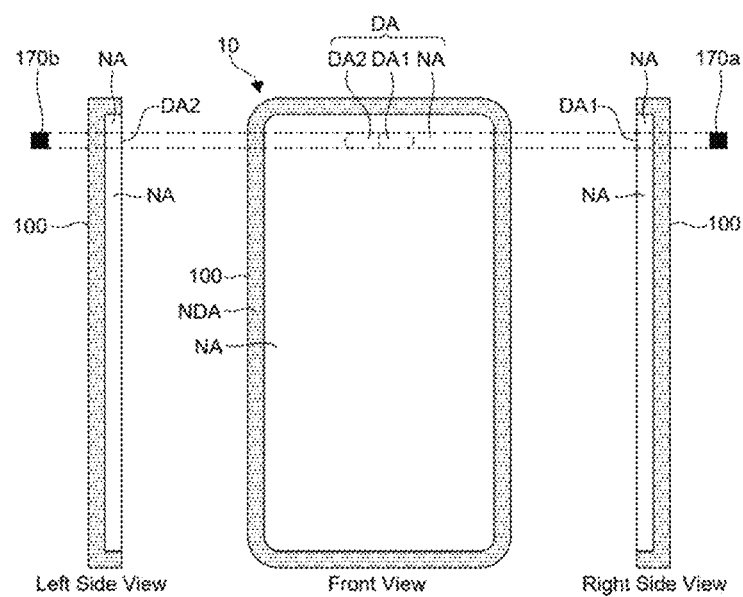

In the example shown in FIG. 6D, the display area DA may include the normal area NA, the first optical area DA1, and the second optical area DA2. In the example shown in FIG. 6D, the normal area NA is not present between the first optical area DA1 and the second optical area DA2. In other words, the first optical area DA1 and the second optical area DA2 may be in contact with each other. Here, the first optical area DA1 may at least partially overlap the first optical electronic device 170a, and the second optical area DA2 may at least partially overlap the second optical electronic device 170b.

One or more optical areas DA1 and DA2 may be formed to have both the image displaying structure and the light transmission structure. In other words, one or more optical areas DA1 and DA2 are partial areas of the display area DA, and therefore the sub-pixels for displaying an image are required to be disposed in one or more optical areas DA1 and DA2. One or more optical areas DA1 and DA2 are required to have the light transmission structure for transmitting light to one or more optical electronic devices 170, 170a and 170b.

One or more optical electronic devices 170, 170a and 170b are devices that are required to receive light, but located behind (underneath, or on the opposite side of the viewing side of) the display panel 100 to receive light transmitted through the display panel 100.

One or more optical electronic devices 170, 170a and 170b are not exposed on the front side (or viewing side) of the display panel 100. Therefore, the optical electronic devices 170, 170a and 170b are not viewable to a user even when s/he views the front side of the display device 10.

For example, the first optical electronic devices 170 and 170a may be cameras, and the second optical electronic device 170b may be a proximity sensor, an illumination sensor, or the like detection sensor. For example, the detection sensor may be an infrared sensor that detects infrared light.

On the other hand, the first optical electronic devices 170 and 170a may be detection sensors, and the second optical electronic device 170b may be a camera.

In the following example, for convenience of description, the first optical electronic devices 170 and 170a are cameras and the second optical electronic device 170b is the detection sensor. Here, the camera may be a camera lens or an image sensor.

When the first optical electronic devices 170 and 170a are the cameras, these cameras are located behind (underneath) the display panel 100, but may be a front camera that captures images in a frontward direction of the display panel 100. Therefore, a user can take an image through the camera invisible on the viewing side while looking at the viewing side of the display panel 100.

The normal area NA and one or more optical areas DA1 and DA2 included in the display area DA are areas where an image is displayable. However, the normal area NA is an area where the light transmission structure is not required to be formed, and one or more optical areas DA1 and DA2 are areas where the light transmission structure is required to be formed.

Therefore, one or more optical areas DA1 and DA2 are required to have a transmittance higher than or equal to a certain level, and the normal area NA may have no transmittance or a transmittance lower than a certain level.

For example, one or more optical areas DA1 and DA2 and the normal area NA may be different in resolutions, sub-pixel layout structures, the number of sub-pixels per unit area, electrode structure, line structures, electrode layout structures, line layout structures, etc.

For example, the number of sub-pixels per unit area in one or more optical areas DA1 and DA2 may be less than the number of sub-pixels per unit area in the normal area NA. In other words, the resolution of one or more optical areas DA1 and DA2 may be lower than the resolution of the normal area NA. In this case, the number of sub-pixels per unit area refers to a unit for measuring the resolution, and may also be referred to as a pixels per inch (PPI), which means the number of pixels in one inch.

For example, the number of sub-pixels per unit area in the first optical area DA1 may be less than the number of sub-pixels per unit area in the normal area NA. The number of sub-pixels per unit area in the second optical area DA2 may be greater than or equal to the number of sub-pixels per unit area in the first optical area DA1.

The first optical area DA1 may have various shapes such as a circular, oval, rectangular, hexagonal, or octagonal shape. The second optical area DA2 may also have various shapes such as a circular, oval, rectangular, hexagonal, or octagonal shape. The first optical area DA1 and the second optical area DA2 may have the same shape or different shapes.

Referring to FIG. 6C, when the first optical area DA1 and the second optical area DA2 are in contact with each other, the entire optical area including the first optical area DA1 and the second optical area DA2 may also have various shapes such as a circular, oval, rectangular, hexagonal, or octagonal shape.

In the following example, for convenience of description, each of the first optical area DA1 and the second optical area DA2 is shaped like a circle.

In the display device 10 according to an embodiment, when the first optical electronic devices 170 and 170a not exposed to the outside but hidden underneath the display panel 100 are cameras, the display device 10 according to an embodiment may be a display based on under-display camera (UDC) technology.

Accordingly, the display device 10 according to an embodiment is not required to form a notch or camera hole for exposing the camera in the display panel 100, the area of the display area DA is not reduced.

Thus, the display panel 100 is not required to have the notch or camera hole for exposing the camera, thereby decreasing a bezel area, and increasing the degree of freedom in design without design constraints.

In the display device 10 according to an embodiment, one or more optical electronic devices 170, 170a and 170b need to receive light normally and perform their predetermined functions normally even though one or more optical electronic devices 170, 170a and 170b are hidden behind the display panel 100.

Further, in the display device 10 according to an embodiment, one or more optical areas DA1 and DA2 overlapping one or more optical electronic devices 170, 170a and 170b in the display area DA are required to normally display an image even though one or more optical electronic devices 170, 170a and 170b are hidden behind the display panel 100 and disposed to overlap the display area DA.

Thus, the display device 10 according to an embodiment of the disclosure may be structured to improve the transmittance of the first optical area DA1 and the second optical area DA2 overlapping the optical electronic devices 170, 170a and 170b.

Figure 7:
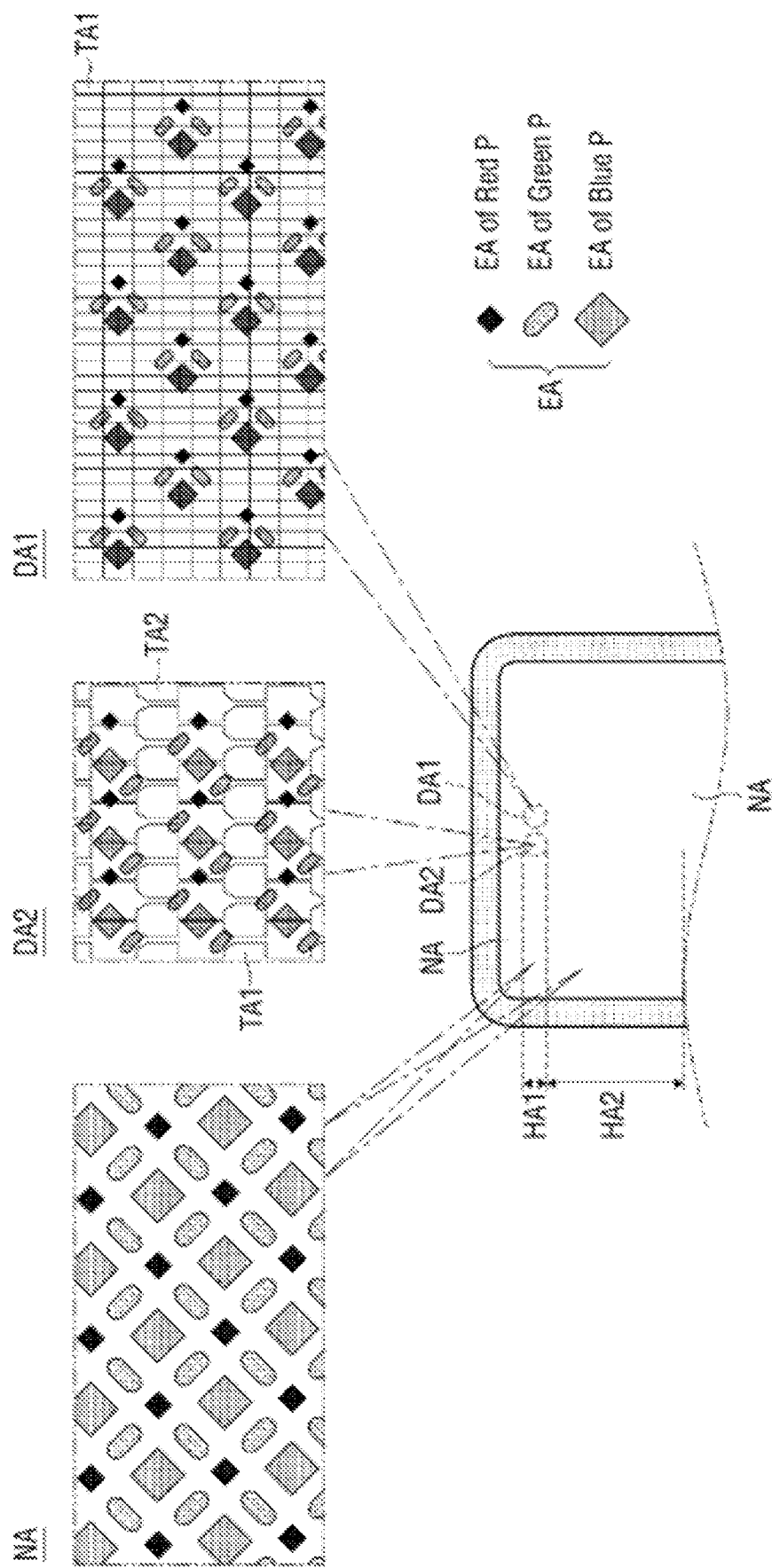
FIG. 7 is a view showing the layout of sub-pixels of a display area in a display panel according to an embodiment.

FIG. 7 is a view showing the layout of sub-pixels of a display area in a display panel according to an embodiment.

FIG. 7 shows the layout of sub-pixels SP in three areas NA, DA1, and DA2 included in the display area in the display panel according to an embodiment.

Referring to FIG. 7, a plurality of sub-pixels SP may be disposed in each of the normal area NA, the first optical area DA1 and the second optical area DA2 included in the display area.

For example, the plurality of sub-pixels SP may include a red sub-pixel Red SP to emit red light, a green sub-pixel Green SP to emit green light, and a blue sub-pixel Blue SP to emit blue light.

Thus, each of the normal area NA, the first optical area DA1 and the second optical area DA2 may include an emission area EA of the red sub-pixel Red SP, an emission area EA of the green sub-pixel Green SP, and an emission area EA of the blue sub-pixel Blue SP.

Referring to FIG. 7, the normal area NA may not include the light transmission structure, but include the emission area EA.

However, the first optical area DA1 and the second optical area DA2 need to include not only the emission area EA but also the light transmission structure.

Therefore, the first optical area DA1 may include the emission area EA and a first transmission area TA1, and the second optical area DA2 may include the emission area EA and a second transmission area TA2.

The emission area EA and the transmission areas TA1 and TA2 may be distinguished based on their light transmission capabilities. In other words, the emission area EA may be an area where light is not transmittable, and the transmission areas TA1 and TA2 may be areas where light is transmittable.

Further, the emission area EA and the transmission areas TA1 and TA2 may be distinguished based on the presence of a particular metal layer. For example, the emission area EA may be formed with the cathode, but the transmission areas TA1 and TA2 may not be formed with the cathode. Further, the emission area EA may be formed with the light shielding layer, but the transmission areas TA1 and TA2 may not be formed with the light shielding layer.

In this case, the first optical area DA1 includes the first transmission area TA1, and the second optical area DA2 includes the second transmission area TA2. Therefore, both the first optical area DA1 and the second optical area DA2 are areas where light is transmittable.

In this case, the first optical area DA1 may have the same transmittance (or transmission level) as the second optical area DA2.

In this case, the first transmission area TA1 of the first optical area DA1 may have the same shape or size as the second transmission area TA2 of the second optical area DA2. Alternatively, although the first transmission area TA1 of the first optical area DA1 and the second transmission area TA2 of the second optical area DA2 are different in shape or size, a proportion of the first transmission area TA1 in the first optical area DA1 may be equal to a proportion of the second transmission area TA2 in the second optical area DA2.

In contrast, the transmittance (transmission level) of the first optical area DA1 may be different from the transmittance (transmission level) of the second optical area DA2.

In this case, the first transmission area TA1 of the first optical area DA1 may be different in shape or size from the second transmission area TA2 of the second optical area DA2. Alternatively, although the first transmission area TA1 of the first optical area DA1 has the same shape or size as the second transmission area TA2 of the second optical area DA2, a proportion of the first transmission area TA1 in the first optical area DA1 may be different from a proportion of the second transmission area TA2 in the second optical area DA2.

For example, when the first optical electronic device overlapping the first optical area DA1 is a camera and the second optical electronic device overlapping the second optical area DA2 is a detection sensor, the camera may need the quantity of light more than that of the detection sensor.

Therefore, the transmittance (transmission level) of the first optical area DA1 may be greater than the transmittance (transmission level) of the second optical area DA2.

In this case, the first transmission area TA1 of the first optical area DA1 may be larger than the second transmission area TA2 of the second optical area DA2. Alternatively, although the first transmission area TA1 of the first optical area DA1 has the same size as the second transmission area TA2 of the second optical area DA2, a proportion of the first transmission area TA1 in the first optical area DA1 may be higher than a proportion of the second transmission area TA2 in the second optical area DA2.

In the following example, for convenience of description, the transmittance (transmission level) of the first optical area DA1 is greater than the transmittance (transmission level) of the second optical area DA2.

Further, as shown in FIG. 7, the transmission areas TA1 and TA2 may be referred to as a transparent area, and the transmittance may also be referred to as transparency.

Further, as shown in FIG. 7, according to an embodiment, it will be assumed that the first optical area DA1 and the second optical area DA2 are located in an upper portion of the display area of the display panel and disposed side by side.

Referring to FIG. 7, a horizontal display area where the first optical area DA1 and the second optical area DA2 are disposed is referred to as a first horizontal display area HA1, and a horizontal display area where the first optical area DA1 and the second optical area DA2 are not disposed is referred to as a second horizontal display area HA2.

Referring to FIG. 7, the first horizontal display area HA1 may include the normal area NA, the first optical area DA1, and the second optical area DA2. On the other hand, the second horizontal display area HA2 may include only the normal area NA.

Figure 8A:
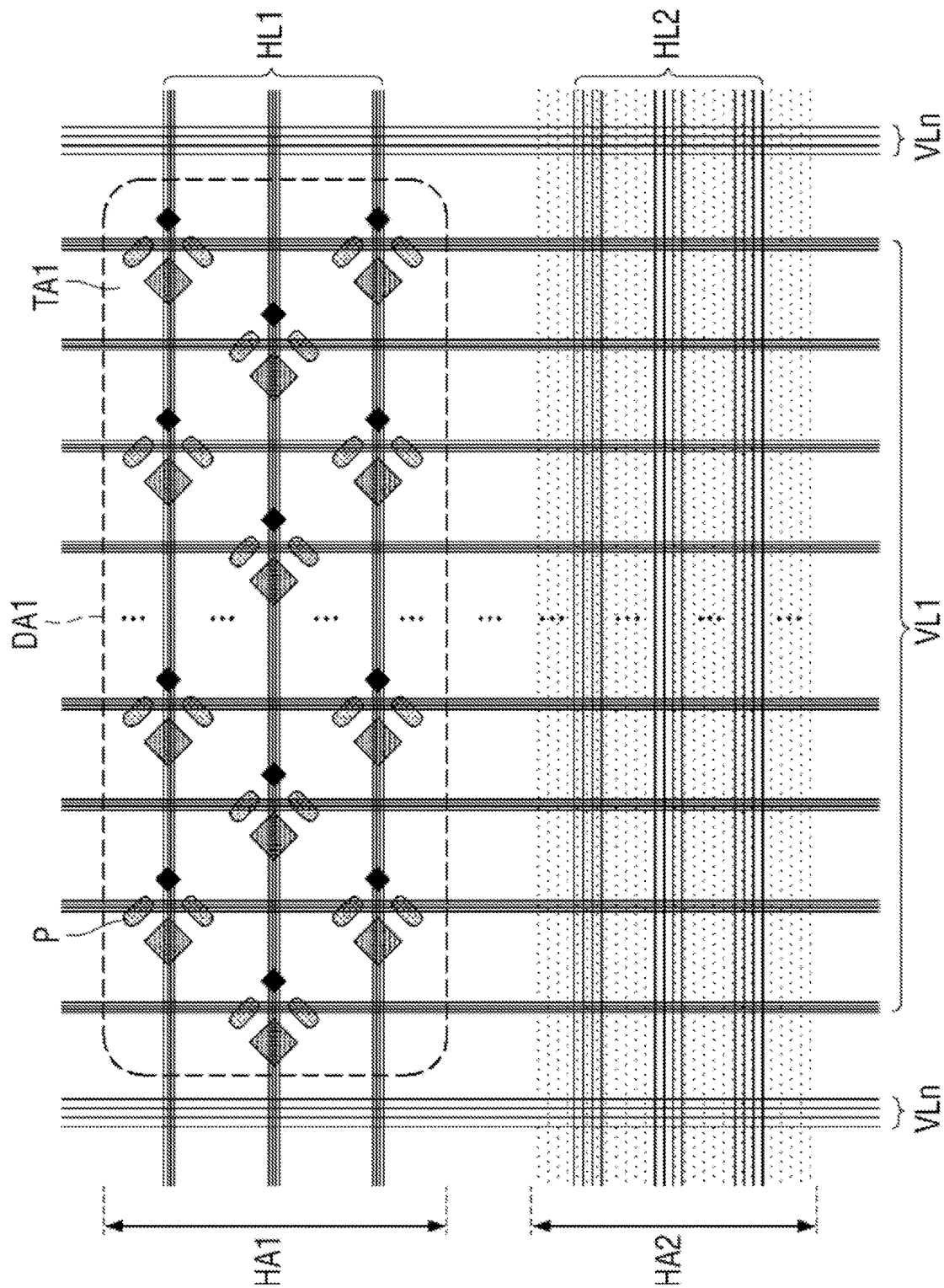
FIG. 8A is a view showing, for example, the layout of signal lines in each of a first optical area and a normal area in a display panel according to an embodiment.
Figure 8B:
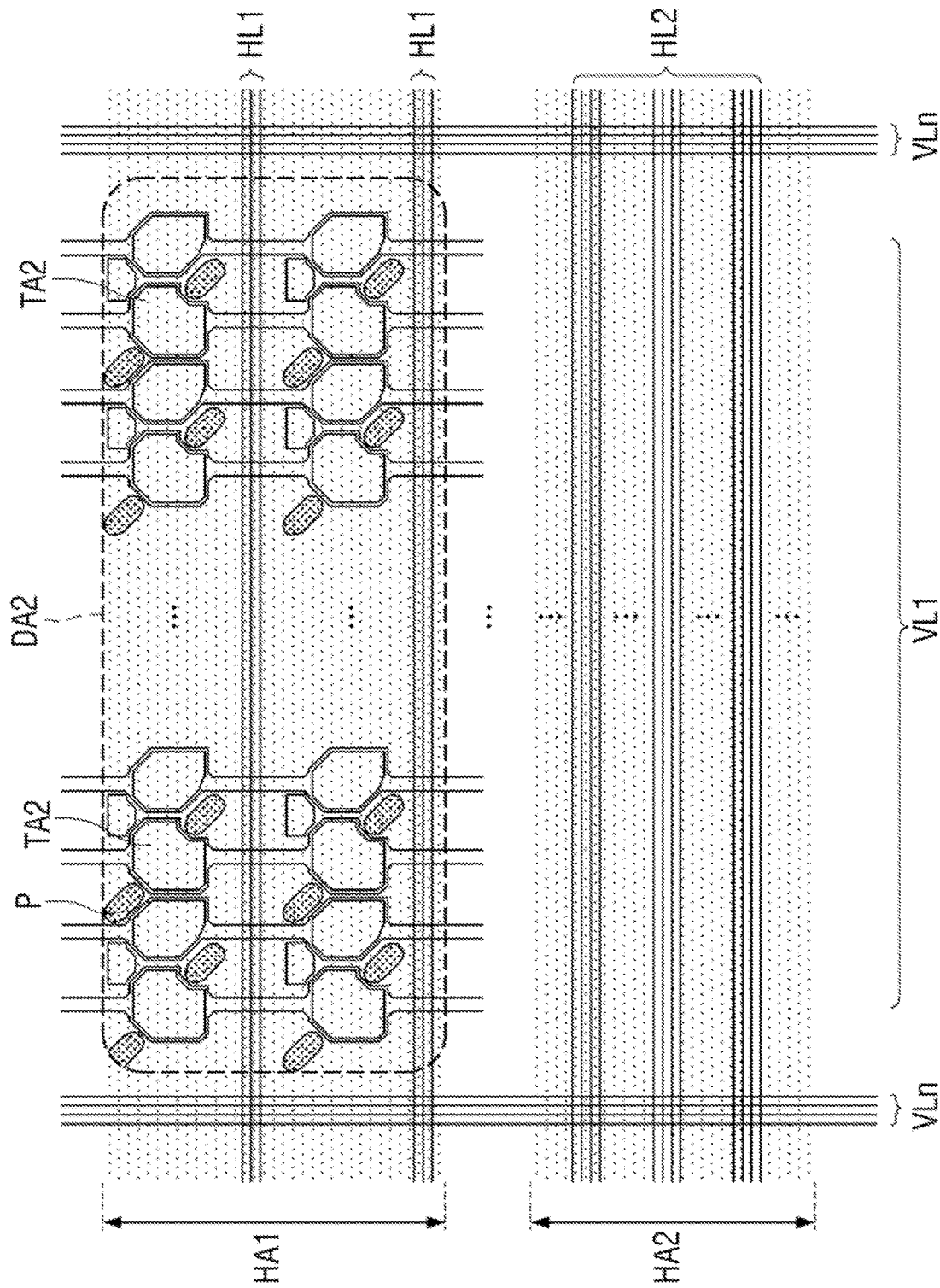
FIG. 8B is a view showing, for example, the layout of signal lines in each of a second optical area and a normal area in a display panel according to an embodiment.

FIG. 8A is a view showing, for example, the layout of signal lines in each of a first optical area and a normal area in a display panel according to an embodiment. FIG. 8B is a view showing, for example, the layout of signal lines in each of a second optical area and a normal area in a display panel according to an embodiment.

FIG. 8A illustrates the layout of signal lines in each of the first optical area DA1 and the normal area in the display panel according to an embodiment, and FIG. 8B illustrates the layout of signal lines in each of the second optical area DA2 and the normal area in the display panel according to an embodiment.

In FIGS. 8A and 8B, the illustrated first horizontal display area HA1 is a part of the first horizontal display area HA1 in the display panel, and the illustrated second horizontal display area HA2 is a part of the second horizontal display area HA2 in the display panel.

The first optical area DA1 shown in FIG. 8A is a part of the first optical area DA1 in the display panel, and the second optical area DA2 shown in FIG. 8B is a part of the second optical area DA2 in the display panel.

Referring to FIGS. 8A and 8B, the first horizontal display area HA1 may include the normal area, the first optical area DA1 and the second optical area DA2. The second horizontal display area HA2 may include the normal area.

In the display panel, various types of horizontal lines HL1 and HL2 may be arranged, and various types of vertical lines VLn, VL1, and VL2 may be arranged.

According to an embodiment, a horizontal direction and a vertical direction refer to two intersecting directions, in which the horizontal direction and the vertical direction may vary depending on a viewing direction. For example, according to an embodiment, the horizontal direction may refer to a direction where a gate line is extended and arranged, and the vertical direction may refer to a direction where a data line is extended and arranged. In this way, the horizontal and vertical directions are given by way of example.

Referring to FIGS. 8A and 8B, the horizontal lines arranged in the display panel may include a first horizontal line HL1 disposed in the first horizontal display area HA1, and a second horizontal line HL2 disposed in the second horizontal display area HA2.

The horizontal lines arranged in the display panel may be the gate lines. In other words, the first horizontal line HL1 and the second horizontal line HL2 may be the gate lines. The gate lines may include various types of gate lines according to the structures of the sub-pixel.

Referring to FIGS. 8A and 8B, the vertical lines arranged in the display panel may include normal vertical lines VLn disposed only in the normal area, a first vertical line VL1 passing through both the first optical area DA1 and the normal area, and a second vertical line VL2 passing through both the second optical area DA2 and the normal area.

The vertical lines arranged in the display panel may include the data lines, driving voltage lines, etc. and may further include reference voltage lines, initialization voltage lines, etc. In other words, the normal vertical line VLn, the first vertical line VL1, and the second vertical line VL2 may include the data lines, the driving voltage lines, etc., and may further include the reference voltage lines, the initialization voltage lines, etc.

According to an embodiment, the term "horizontal" in the second horizontal line HL2 may only mean that a signal is transmitted from the left (or right) to the right (or left), and may not mean that the second horizontal line HL2 extends straightly only in the exactly horizontal direction. In other words, the second horizontal line HL2 of FIGS. 8A and 8B is illustrated as a straight line, but the second horizontal line HL2 may alternatively include a bent or curved portion. Likewise, the first horizontal line HL1 may also include a bent or curved portion.

According to an embodiment, the term "vertical" in the normal vertical line VLn may only mean that a signal is transmitted from the top (or bottom) to the bottom (or top), and may not mean that the normal vertical line VLn extends straightly only in the exactly vertical direction. In other words, the normal vertical line VLn of FIGS. 8A and 8B is illustrated as a straight line, but the normal vertical line VLn may alternatively include a bent or curved portion. Likewise, the first vertical line VL1 and the second vertical line VL2 may also include a bent or curved portion.

Referring to FIG. 8A, the first optical area DA1 included in the first horizontal area HA1 may include an emission area and a first transmission area. Within the first optical area DA1, the outer area of the first transmission area may include the emission area.

Referring to FIG. 8A, to improve the transmittance of the first optical area DA1, the first horizontal line HL1 passing through the first optical area DA1 may pass avoiding the first transmission area within the first optical area DAL.

Therefore, each first horizontal line HL1 passing through the first optical area DA1 may include a curved section, a bent section, or the like diverted outside the outer edge of each first transmission area.

Thus, the first horizontal line HL1 disposed in the first horizontal area HA1 and the second horizontal line HL2 disposed in the second horizontal area HA2 may be different in shape, length, etc. from each other. In other words, the first horizontal line HL1 that passes through the first optical area DA1 may be different in shape, length, etc. from the second horizontal line HL2 that does not pass through the first optical area DAL.

Further, to improve the transmittance of the first optical area DA1, the first vertical line VL1 passing through the first optical area DA1 may pass avoiding the first transmission area within the first optical area DAL.

Therefore, each first vertical line VL1 passing through the first optical area DA1 may include the curved section, the bent section, and the like diverted outside the outer edge of each first transmission area.

Thus, the first vertical line VL1 that passes through the first optical area DA1 may be different in shape, length, etc. from the normal vertical line VLn that does not pass through the first optical area DA1 and is disposed in the normal area.

Referring to FIG. 8A, the first transmission area included in the first optical area DA1 within the first horizontal area HA1 may be arranged in an oblique direction.

Referring to FIG. 8A, the emission area may be disposed between two adjacent first transmission areas arranged side by side in the first optical area DA1 within the first horizontal area HA1. The emission area may be disposed between two adjacent first transmission areas arranged up and down in the first optical area DA1 within the first horizontal area HA1.

Referring to FIG. 8A, all of the first horizontal lines HL1 disposed in the first horizontal area HA1, in other words, the first horizontal lines HL1 passing through the first optical area DA1 may include at least one curved or bent section diverted outside the outer edge of the first transmission area.

Referring to FIG. 8B, the second optical area DA2 included in the first horizontal area HA1 may include the emission area and the second transmission area TA2. Within the second optical area DA2, the outer area of the second transmission area TA2 may include the emission area.

The positions and arrangements of the emission area and the second transmission area TA2 within the second optical area DA2 may be the same as the positions and arrangements of the emission area and the first transmission area within the first optical area DA1 of FIG. 8A.

On the other hand, as shown in FIG. 8B, the positions and arrangements of the emission area and the second transmission area TA2 within the second optical area DA2 may be different from the positions and arrangements of the emission area and the first transmission area within the first optical area DA1 of FIG. 8A.

For example, referring to FIG. 8B, within the second optical area DA2, the second transmission areas TA2 may be arranged in the horizontal direction (left and right directions). The emission area may not be disposed between two adjacent second transmission areas TA2 arranged in the horizontal direction (left and right directions). Further, the emission area within the second optical area DA2 may be arranged between the second transmission areas TA2 adjacent to each other in the vertical direction (up and down directions). In other words, the emission area may be disposed between two rows of the second transmission areas TA2.

The first horizontal lines HL1 may pass through the second optical area DA2 and the normal area around the second optical area DA2 within the first horizontal area HA1, in the same form as those in FIG. 8A.

On the other hand, as shown in FIG. 8B, the first horizontal lines HL1 may pass through the second optical area DA2 and the normal area around the second optical area DA2 within the first horizontal area HA1, in different forms from those in FIG. 8A.

In other words, the positions and arrangements of the emission area and the second transmission area TA2 within the second optical area DA2 of FIG. 8B are different from the positions and arrangements of the emission area and the first transmission area within the first optical area DA1 of FIG. 8A.

Referring to FIG. 8B, the first horizontal lines HL1 may pass straightly without a curved or bent section between the second transmission areas TA2 adjacent to each other up and down when passing through the second optical area DA2 and the normal area around the second optical area DA2 within the first horizontal area HA1.

In other words, one horizontal line HL1 may have a curved or bent section within the first optical area DA1, but may not have a curved or bent section within the second optical area DA2.

To improve the transmittance of the second optical area DA2, the second vertical line VL2 passing through the second optical area DA2 may pass avoiding the second transmission area TA2 within the second optical area DA2.

Therefore, each second vertical line VL2 passing through the second optical area DA2 may include a curved section, a bent section or the like diverted outside the outer edge of each second transmission area TA2.

Thus, the second vertical line VL2 passing through the second optical area DA2 may be different in shape, length, etc. from the normal vertical line VLn disposed in the normal area without passing through the second optical area DA2.

As shown in FIG. 8A, the first horizontal lines HL1 passing through the first optical area DA1 may have the curved or bent sections diverted outside the outer edge of the first transmission area.

Therefore, the first horizontal line HL1 passing through the first optical area DA1 and the second optical area DA2 may be slightly longer than the second horizontal line HL2 disposed only in the normal area without passing through the first optical area DA1 and the second optical area DA2.

Thus, the resistance (hereinafter referred to as first resistance) of the first horizontal line HL1 passing through the first optical area DA1 and the second optical area DA2 may be slightly greater than the resistance (hereinafter referred to as second resistance) of the second horizontal line HL2 disposed only in the normal area without passing through the first optical area DA1 and the second optical area DA2.

Referring to FIGS. 8A and 8B, according to the light transmission structures, the first optical area DA1 overlapping at least partially with the first optical electronic device includes a plurality of first transmission areas, and the second optical area DA2 overlapping at least partially with the second optical electronic device includes the plurality of the second transmission area TA2. Therefore, the first optical area DA1 and the second optical area DA2 may have a smaller number of sub-pixels per unit area than the normal area.

The number of sub-pixels to which the first horizontal lines HL1 passing through the first optical area DA1 and the second optical area DA2 are connected may be different from the number of sub-pixels to which the second horizontal lines HL2 disposed only in the normal area without passing through the first optical area DA1 and the second optical area DA2 are connected.

The number (first number) of sub-pixels to which the first horizontal lines HL1 passing through the first optical area DA1 and the second optical area DA2 are connected may be less than the number (second number) of sub-pixels to which the second horizontal lines HL2 disposed only in the normal area without passing through the first optical area DA1 and the second optical area DA2 are connected.

A difference between the first number and the second number may be varied depending on a difference between each resolution of the first optical area DA1 and the second optical area DA2 and the resolution of the normal area. For example, the larger the difference between each resolution of the first optical area DA1 and the second optical area DA2 and the resolution of the normal area, the larger the difference between the first number and the second number.

As described above, because the number (first number) of sub-pixels to which the first horizontal lines HL1 passing through the first optical area DA1 and the second optical area DA2 are connected is less than the number (second number) of sub-pixels to which the second horizontal lines HL2 disposed only in the normal area without passing through the first optical area DA1 and the second optical area DA2 are connected, the area where the first horizontal line HL1 overlaps other surrounding electrodes or lines may be smaller than the area where the second horizontal line HL2 overlaps other surrounding electrodes or lines.

Therefore, parasitic capacitance (hereinafter referred to as first capacitance) formed between the first horizontal line HL1 and other surrounding electrodes or lines may be significantly smaller than parasitic capacitance (hereinafter referred to as second capacitance) formed between the second horizontal line HL2 and other surrounding electrodes or lines.

Considering a relationship between first resistance and second resistance (the first resistance≥the second resistance) and a relationship between the first capacitance and the second capacitance (first capacitance<<second capacitance), a resistance-capacitance (RC) value (hereinafter referred to as a first RC value) of the first horizontal lines HL1 passing through the first optical area DA1 and the second optical area DA2 may be much smaller than a RC value (hereinafter referred to as a second RC value) of the second horizontal line HL2 disposed only in the normal area without passing through the first optical area DA1 and the second optical area DA2 (first RC value<<second RC value).

Due to the difference between the first RC value of the first horizontal line HL1 and the second RC value of the second horizontal line HL2 (hereinafter referred to as an RC load deviation), a signal transmission characteristic of the first horizontal line HL1 may be different from a signal transmission characteristic of the second horizontal line HL2.

Below, a first driving voltage line VDDL1 and a second driving voltage line VDDL2 will be described according to an embodiment.

Figure 9:
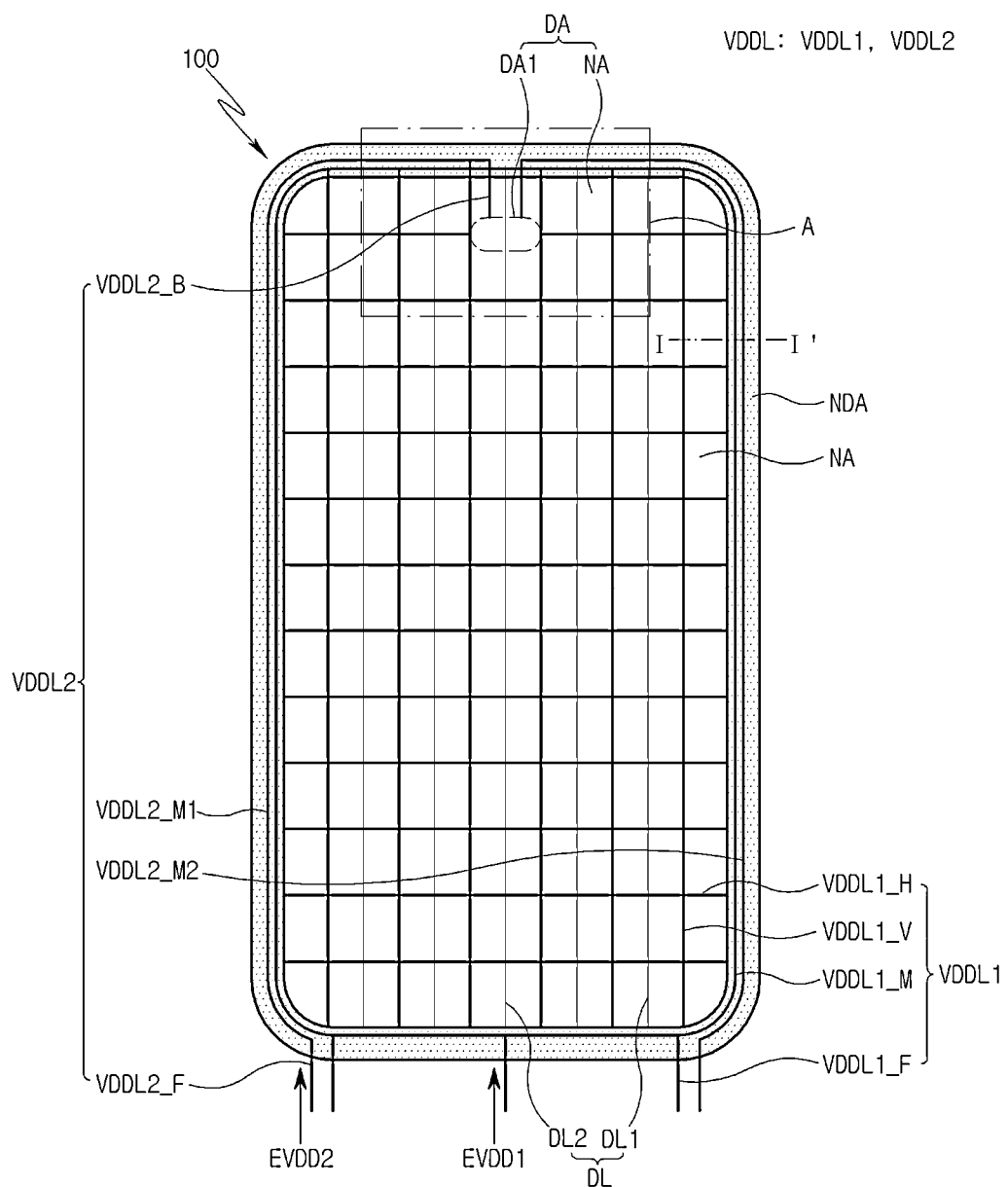
FIG. 9 is a plan view showing first driving voltage lines and second driving voltage lines in a display panel according to an embodiment.
Figure 10:
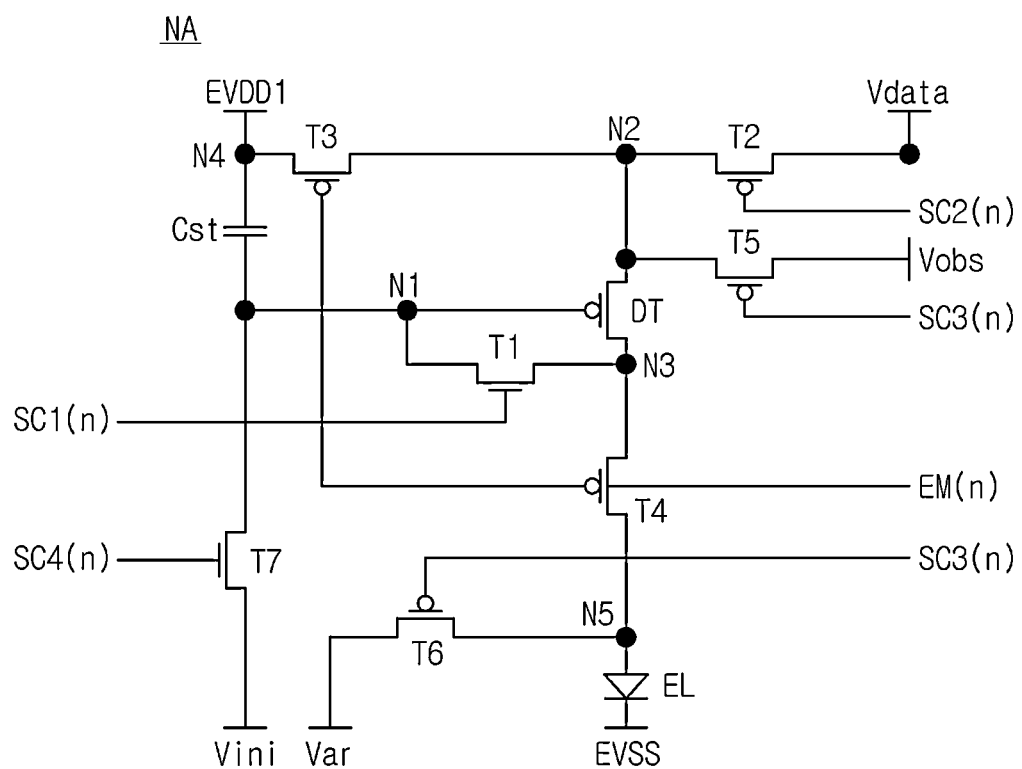
FIG. 10 is a diagram of a pixel circuit in a normal area of a display panel according to an embodiment.
Figure 11:
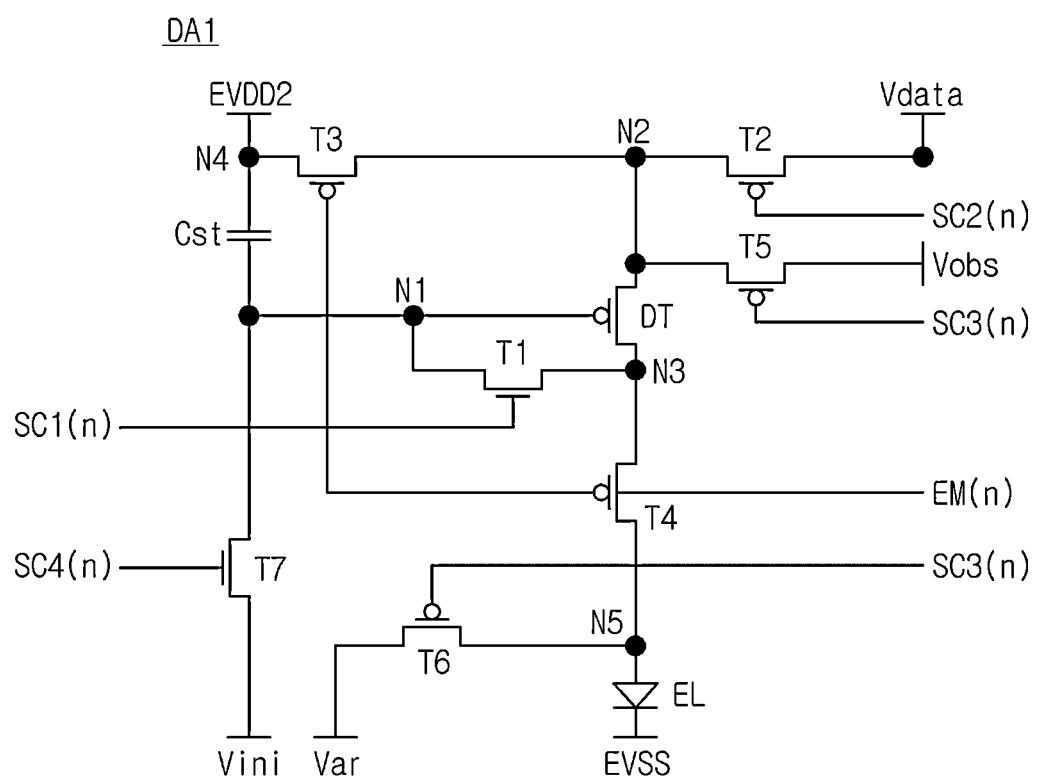
FIG. 11 is a diagram of a pixel circuit in a first optical area of a display panel according to an embodiment.
Figure 12:
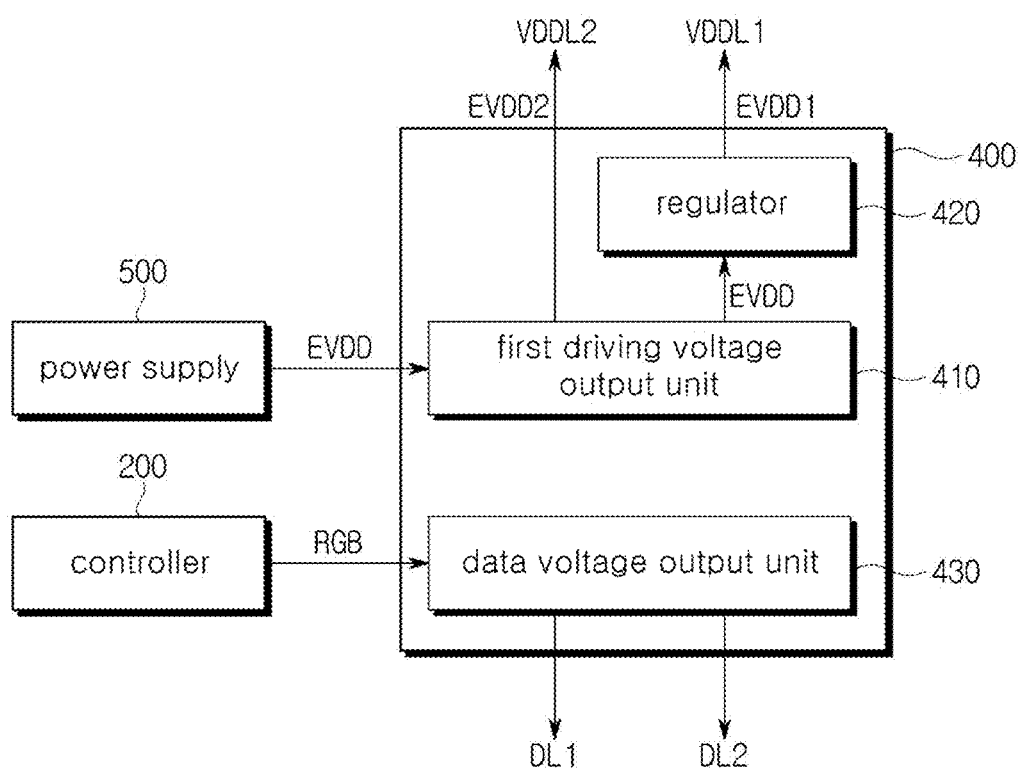
FIG. 12 is a diagram showing a relationship between a controller and a power supply in a data driver of a display device according to an embodiment.

FIG. 9 is a plan view showing first driving voltage lines and second driving voltage lines in a display panel according to an embodiment. FIG. 10 is a diagram of a pixel circuit in a normal area of a display panel according to an embodiment. FIG. 11 is a diagram of a pixel circuit in a first optical area of a display panel according to an embodiment. FIG. 12 is a diagram showing a relationship between a controller and a power supply in a data driver of a display device according to an embodiment. FIG. 9 illustrates the first optical area DA1 by way of example. According to an embodiment, the first optical electronic devices 170 and 170a disposed in the first optical area DA1 may be detection sensors.

For example, the number of sub-pixels per unit area of when the first optical electronic devices 170 and 170a of the first optical area DA1 are the detection sensors (or the proximity sensor) may be greater than the number of sub-pixels per unit area of when the first optical electronic devices 170 and 170a of the first optical area DA1 are the cameras.

Referring to FIGS. 9 to 12, the high-potential driving voltage EVDD is supplied from the power supply 500 as shown in FIG. 1. The high-potential driving voltage EVDD may include a first driving voltage EVDD1, and a second driving voltage EVDD2 that is different from the first driving voltage EVDD1. The power supply 500 may supply the high-potential driving voltage EVDD to the pixels of the display panel 100 through a driving voltage line VDDL. The driving voltage line VDDL may include a first driving voltage line VDDL1 connected to the pixels P of the normal area NA, and a second driving voltage line VDDL2 connected to the pixels P of the first optical area DA1. FIGS. 9 to 12 illustrate that the driving voltage line VDDL includes, but is not limited to, only the first driving voltage line VDDL1 connected to the pixels P of the normal area NA (see FIG. 10) and the second driving voltage line VDDL2 connected to the pixels P of the first optical area DA1 (see FIG. 11). However, the driving voltage line VDDL may further include a third driving voltage line connected to the second optical area (see DA2 in FIG. 6). According to an embodiment, the second driving voltage line VDDL2 may be used in supplying the second driving voltage EVDD2 different from the first driving voltage EVDD1 to the first optical area DA1, and the third driving voltage line may also be used in supplying a third driving voltage different from the first driving voltage EVDD1 to the second optical area DA2. The second driving voltage line VDDL2 and the third driving voltage line may supply the second driving voltage EVDD2 higher than the first driving voltage EVDD1 and the third driving voltage to the optical areas DA1 and DA2 including less pixels P, thereby uniformizing the brightness of the normal area NA, and the optical areas DA1 and DA2. Below, for convenience of description, the description will be made focusing on the second driving voltage EVDD2 and the second driving voltage line VDDL2 used in supplying the second driving voltage EVDD2.

As shown in FIG. 9, the first driving voltage line VDDL1 may include a first fanout driving voltage line VDDL1_F, a first main driving voltage line VDDL1_M, a first horizontal driving voltage line VDDL1_H, and a first vertical driving voltage line VDDL1_V.

The first fanout driving voltage line VDDL1_F may extend from the power supply 500 (see FIG. 12) to the non-display area NDA of the display panel 100. The first main driving voltage line VDDL1_M may be connected to the first fanout driving voltage line VDDL1_F and disposed on the non-display area NDA. The first main driving voltage line VDDL1_M may be formed in all the non-display areas NDA located on the left, right, upper and lower sides of the display area DA (relative to the plane of FIG. 9). In other words, the first main driving voltage line VDDL1_M may completely surround the display area DA on the plane. The first horizontal driving voltage line VDDL_H may extend along a horizontal direction (or transverse direction), and connect the first main driving voltage line VDDL1_M formed on the left side of the plane and the first main driving voltage line VDDL1_M formed on the right side of the plane. There may be provided a plurality of first horizontal driving voltage lines VDDL1_H, and the plurality of first horizontal driving voltage lines VDDL_H may be spaced apart from each other along a vertical direction (or longitudinal direction). The first vertical driving voltage line VDDL_V may extend along the vertical direction (or longitudinal direction), and connect the first main driving voltage line VDDL1_M formed on the upper side of the plane and the first main driving voltage line VDDL1_M formed on the lower side of the plane. There may be a plurality of first vertical driving voltage line VDDL1_V, and the plurality of first vertical driving voltage line VDDL_V may be spaced apart from each other along the horizontal direction (or transverse direction).

As shown in FIG. 9, the second driving voltage line VDDL2 may include a second fanout driving voltage line VDDL2_F, a 2-1st main driving voltage line VDDL2_M1, a 2-2nd main driving voltage line VDDL2_M2, and a second branch driving voltage line VDDL2_B.

The second fanout driving voltage line VDDL2_F may extend from the power supply 500 (see FIG. 12) to the non-display area NDA of the display panel 100. Each of the 2-1st main driving voltage line VDDL2_M1 and the 2-2nd main driving voltage line VDDL2_M2 may be connected to the second fanout driving voltage line VDDL2_F and disposed on the non-display area NDA. The 2-1st main driving voltage line VDDL2_M1 may be formed in the non-display area NDA located on the lower, left and upper sides of the display area DA (relative to the plane of FIG. 9), and the 2-2nd main driving voltage line VDDL2_M2 may be formed in the non-display area NDA located on the lower, right and upper sides of the display area DA (relative to the plane of FIG. 9). For example, the 2-1st main driving voltage line VDDL2_M1 may be connected to the second fanout driving voltage line VDDL2_F, extended up to the lower non-display area NDA, the left non-display area NDA, and the upper non-display area NDA, and connected to the second branch driving voltage line VDDL2_B. The 2-2nd main driving voltage line VDDL2_M2 may be connected to the second fanout driving voltage line VDDL2_F, extended up to the lower non-display area NDA, the right non-display area NDA, and the upper non-display area NDA, and connected to the second branch driving voltage line VDDL2_B. On the upper non-display area NDA, the end portion of the 2-1st main driving voltage line VDDL2_M1 and the end portion of the 2-2nd main driving voltage line VDDL2_M2 may be spaced apart from each other in the horizontal direction. There may be a plurality of second branch driving voltage lines VDDL2_B. The plurality of second branch driving voltage line VDDL2_B may be connected to each of the 2-1st main driving voltage line VDDL2_M1 and the 2-2nd main driving voltage line VDDL2_M2. The plurality of second branch driving voltage lines VDDL2_B may be extended on plane up to the first optical area DA1 and connected to the pixels P in the first optical area DA1.

As shown in FIG. 9, the data lines DL may include a first data line DL1 and a second data line DL2. The first data line DL1 and the second data line DL2 may be extended along the vertical direction (or longitudinal direction). The first data line DL1 may be connected to the pixels P of the normal area NA, and the second data line DL2 may be connected to the pixels P of the first optical area DA1.

As shown in FIG. 12, the power supply 500 supplies the high-potential driving voltage EVDD to a first driving voltage output unit 410 of the data driver 400. The first driving voltage output unit 410 (e.g., a circuit) may supply the received high-potential driving voltage EVDD to the second driving voltage line VDD2 as it is (in other words, the high-potential driving voltage EVDD and the second driving voltage EVDD2 have the same voltage level), or may supply the received high-potential driving voltage EVDD to a regulator 420 (e.g., a circuit) of the data driver 400. The regulator 420 may lower the voltage of the received high-potential driving voltage EVDD, and supply the lowered voltage to the first driving voltage line VDD1. In other words, the first driving voltage EVDD1 may be lower than the second driving voltage EVDD2, and, conversely, the second driving voltage EVDD2 may be higher than the first driving voltage EVDD1. In some embodiments, the second driving voltage line VDDL2 may be connected to the regulator 420, and the regulator 420 may supply the second driving voltage EVDD2 having the same level as the received high-potential driving voltage EVDD to the second driving voltage line VDDL2 connected to the regulator 420.

As described above with reference to FIG. 1, the controller 200 may process the image data RGB received from the outside to be suitable for the size and resolution of the display panel 100 and supply the processed image data RGB to the data driver 400. A data voltage output unit 430 (e.g., a circuit) may include a gamma converter, and the gamma converter may supply the data voltage based on a first gamma value to the first data line DL1 and supply the data voltage based on a second gamma value to the second data line DL2. For example, the first gamma value may be 8 bits, and the second gamma value may be 9 bits.

As described above with reference to FIG. 6, the number of sub-pixels (or pixels) per unit area in the first optical area DA1 may be less than the number of sub-pixels (or pixels) per unit area in the normal area NA. In other words, the resolution of the first optical area DA1 may be lower than the resolution of the normal area NA. For example, the number of sub-pixels per unit area in the first optical area DA1 may be less than the number of sub-pixels per unit area in the normal area NA.

However, in the display device 10 according to an embodiment, the first driving voltage line VDDL1 and the second driving voltage line VDDL2 are physically separated, the first driving voltage EVDD1 is supplied to the pixels P of the normal area NA through the first driving voltage line VDDL1, and the second driving voltage EVDD2 higher than the first driving voltage EVDD1 is supplied to the pixels P of the first optical area DA1 through the second driving voltage line VDDL2, thereby decreasing the difference in resolution (or brightness) between the normal area NA and the first optical area DA1.

Furthermore, the first data line DL1 and the second data line DL2 are physically separated, the data voltage based on the first gamma value is supplied to the pixels P of the normal area NA through the first data line DL1, and the data voltage based on the second gamma value greater than the first gamma value to the pixels P of the first optical area DA1 through the second data line DL2, thereby decreasing the difference in resolution (or brightness) between the normal area NA and the first optical area DA1.

In more detail, in the display device according to an embodiment, the second driving voltage EVDD2 may be higher than the first driving voltage EVDD1. The higher the driving voltage, the larger brightness variation based on a gray level. However, according to an embodiment, the data voltage based on the second gamma value greater than the first gamma value is supplied to the pixels P of the first optical area DA1 to which higher driving voltage is applied, thereby enhancing the expression of the gray level. In other words, the expression of the gray level is improved to accurately correct a difference in colors as well as brightness between the normal area NA and the first optical area DA1.

Figure 13:
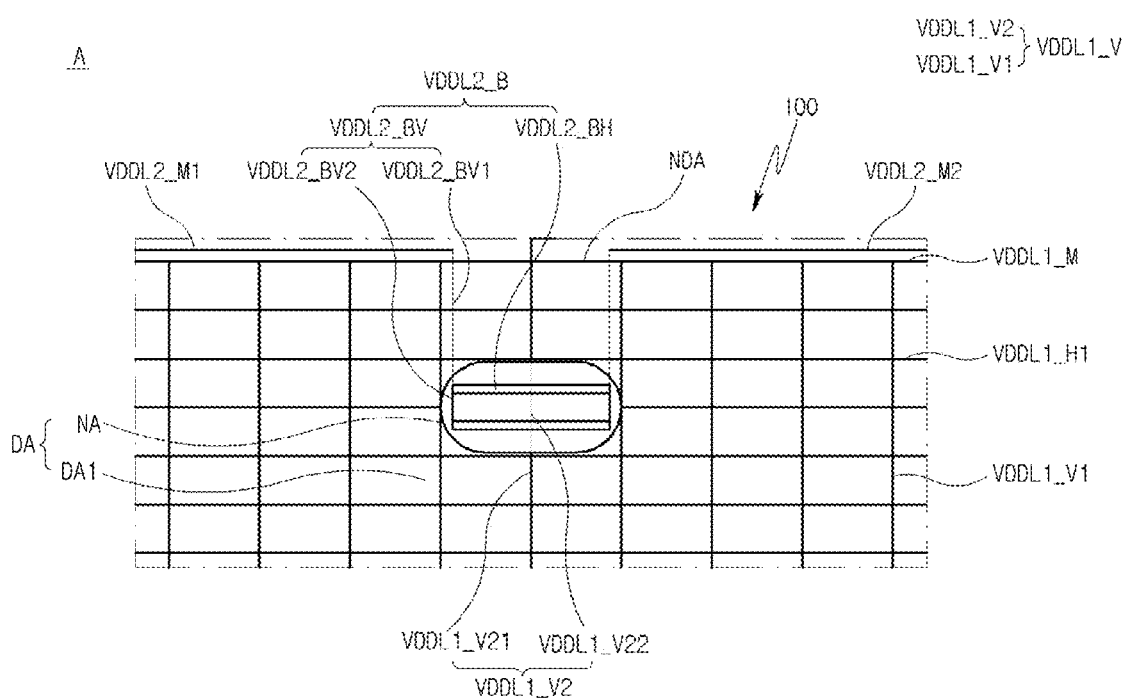
FIG. 13 is an enlarged plan view of an area A in FIG. 9 according to an embodiment.

FIG. 13 is an enlarged plan view of an area A in FIG. 9 according to one embodiment.

Referring to FIGS. 9 and 13, the first vertical driving voltage line VDDL1_V may include a 1-1st vertical driving voltage line VDDL1_V1, and a 1-2nd vertical driving voltage line VDDL1_V2. The 1-2nd vertical driving voltage line VDDL1_V2 may pass through the first optical area DA1 on a plane. The 1-2nd vertical driving voltage line VDDL1_V2 may include a 1-2-1st vertical driving voltage line VDDL1_V21 and a 1-2-2nd vertical driving voltage line VDDL1_V22.

Two 1-2-1st vertical driving voltage lines VDDL1_V21 may be provided, and one of the two 1-2-1st vertical driving voltage lines VDDL1_V21 may extend from the first main driving voltage line VDDL1_M up to the first optical area DA1, and the other one of the two 1-2-1st vertical driving voltage lines VDDL1_V21 may extend from the first optical area DA1 to a downward direction on the plane. A 1-2-2nd vertical driving voltage line VDDL1_V22 may be disposed between two spaced 1-2-1st vertical driving voltage lines VDDL1_V21, and the two spaced 1-2-1st vertical driving voltage lines VDDL1_V21 may be connected through the 1-2-2nd vertical driving voltage lines VDDL1_V22.

As shown in FIG. 13, the second branch driving voltage line VDDL2_B may include a vertical branch driving voltage line VDDL2_BV extended in the vertical direction, and a horizontal branch driving voltage line VDDL2_BH extended in the horizontal direction. The horizontal branch driving voltage line VDDL2_BH may be disposed within the first optical area DA1. There may be a plurality of horizontal branch driving voltage lines VDDL2_BH, and the plurality of horizontal branch driving voltage lines VDDL2_BH may be spaced apart in the vertical direction. The horizontal branch driving voltage line VDDL2_BH may be connected to the left vertical branch driving voltage line VDDL2_BV and the right vertical branch driving voltage line VDDL2_BV.

The vertical branch driving voltage line VDDL2_BV may include the left vertical branch driving voltage line VDDL2_BV connected to the 2-1st main driving voltage line VDDL2_M1, and the right vertical branch driving voltage line VDDL2_BV connected to the 2-2nd main driving voltage line VDDL2_M2. Each vertical branch driving voltage line VDDL2_BV may include a 1-1st vertical branch driving voltage line VDDL2_BV1 and a 1-2nd vertical branch driving voltage line VDDL2_BV2. On the plane, the 1-1st vertical branch driving voltage line VDDL2_BV1 may be connected to the 2-1st main driving voltage line VDDL2_M1 or the 2-2nd main driving voltage line VDDL2_M2, and may be connected to the first optical area DA1. The 1-2nd vertical branch driving voltage line VDDL2_BV2 may be disposed within the first optical area DA1. The left 1-2nd vertical branch driving voltage line VDDL2_BV2 and the right 1-2nd vertical branch driving voltage line VDDL2_BV2 may be connected through the foregoing horizontal branch driving voltage line VDDL2_BH.

The first horizontal driving voltage line VDDL1_H may include a 1-1st the horizontal driving voltage line VDDL1_H1. The 1-1st horizontal driving voltage line VDDL1_H1 may pass through the normal area NA but may not pass the first optical area DAL. The 1-1st horizontal driving voltage line VDDL1_H1 may include a left 1-1st horizontal driving voltage line VDDL1_H1 connected to a left end of the first optical area DA1, and aright 1-1st horizontal driving voltage line VDDL1_H1 connected to a right end of the first optical area DA1. On the plane, the left and right 1-1st horizontal driving voltage lines VDDL1_H1 may be spaced apart from each other with respect to the first optical area DA1.

For example, some lines VDDL1_M, VDDL1_H, VDDL1_V1, VDDL1_V21 of the first driving voltage line VDDL1 and some lines VDDL2_M1, VDDL2_M2, VDDL2_BH, VDDL2_BV2 of the second driving voltage line VDDL2 may be located on one conductive layer, and the other lines VDDL1_V22 of the first driving voltage line VDDL1 and the other lines VDDL2_BV1 of the second driving voltage line VDDL2 may be located on another conductive layer. For example, the conductive layer of the display panel 100 (see FIG. 2) may include a first conductive layer on which the first gate electrode GE1 is disposed, a second conductive layer on which the second electrode CST2 is disposed, a third conductive layer on which the second gate electrode GE2 is disposed, a fourth conductive layer on which the source and drain electrodes SD1, SD2, SD3, and SD4 are disposed, a fifth conductive layer on which the intermediate electrode CNE is disposed, and a sixth conductive layer on which the anode ANO is disposed. The one conductive layer may be any one of the first to sixth conductive layers, and the other conductive layer may be any other one of the first to sixth conductive layers.

In other words, in the display device 10 (see FIG. 1) according to an embodiment, some intersecting lines on the plane of the first driving voltage lines VDDL1 and the second driving voltage lines VDDL2 are designed to be disposed in different conductive layers, thereby preventing the first driving voltage line VDDL1 and the second driving voltage line VDDL2 from being short-circuited.

For example, the 1-1st vertical branch driving voltage line VDDL2_BV1 is disposed in one of the conductive layers and thus prevented from being short-circuited with the lines VDDL1_M and VDDL1_H1 disposed in another conductive layer and intersecting the 1-1st vertical branch driving voltage line VDDL2_BV1 on the plane, and the 1-2-2nd vertical driving voltage line VDDL1_V22 is disposed in one conductive layer and thus prevented from being short-circuited with the line VDDL2_BH disposed in another conductive layer and intersecting the 1-2-2nd vertical driving voltage line VDDL1_V22 on the plane.

The 1-1st vertical branch driving voltage line VDDL2_BV1 and the 1-2nd vertical branch driving voltage line VDDL2_BV2 may be connected through a contact hole formed penetrating the insulating films between the conductive layers where they are respectively located, and the 1-2-1st vertical driving voltage line VDDL1_V21 and the 1-2-2nd vertical driving voltage line VDDL1_V22 may be connected through a contact hole formed penetrating the insulating films between their respective conductive layers where they are respectively located.

According to some embodiments, a power supply that generates a driving voltage, and a data driver that receives the driving voltage from the power supply are further provided. The data driver may generate the first driving voltage and the second driving voltage based on the driving voltage, supply the first driving voltage to the first driving voltage line, and supply the second driving voltage to the second driving voltage line.

According to some embodiments, the data driver includes a first driving voltage output unit, and a regulator. The first driving voltage output unit may receive the driving voltage, and supply the driving voltage to the regulator, or generate the driving voltage into the second driving voltage having the same level as the driving voltage.

According to some embodiments, the regulator may convert the driving voltage into the first driving voltage and supply the converted voltage to the first driving voltage line.

According to some embodiments, a controller for providing image data received from the outside to the data driver is further provided. The data driver includes the data voltage output unit, and the data voltage output unit may respectively supply the data voltage based on the first gamma value and the data voltage based on the second gamma value greater than the first gamma value to the pixels of the normal area and the pixels of the optical area.

According to some embodiments, the first data line connected to the pixels of the normal area and the second data line connected to the pixels of the optical area are provided. The data voltage based on the first gamma value may be supplied to the first data line, and the data voltage based on the second gamma value may be supplied to the second data line.

According to some embodiments, the first driving voltage line may include the first main driving voltage line completely surrounding the display area on the plane, and the second driving voltage line may include the second main driving voltage line bypassing the display area on the plane and terminating in the upper non-display area on the plane.

According to some embodiments, the second driving voltage line may further include the second branch driving voltage line branched from the second main driving voltage line on the plane.

According to some embodiments, the second branch driving voltage line may further include the vertical branch driving voltage line extending on the plane from the second main driving voltage line up to the optical area in the vertical direction, and the horizontal branch driving voltage line connected to the vertical branch driving voltage line and extending in the horizontal direction.

According to some embodiments, the first driving voltage line may include the first horizontal driving voltage line connected to the first main driving voltage line and extending in the horizontal direction, and the first vertical driving voltage line connected to the first main driving voltage line and extending in the vertical direction.

According to some embodiments, the vertical branch driving voltage line may be disposed in a conductive layer different from that of the first horizontal driving voltage line intersecting the vertical branch driving voltage line on the plane.

According to some embodiments, the first vertical driving voltage line may be disposed in a conductive layer different from that of the horizontal branch driving line intersecting the first vertical driving voltage line on the plane.

According to some embodiments, the optical electronic device may include the camera or the light receiving device.

Figure 14:
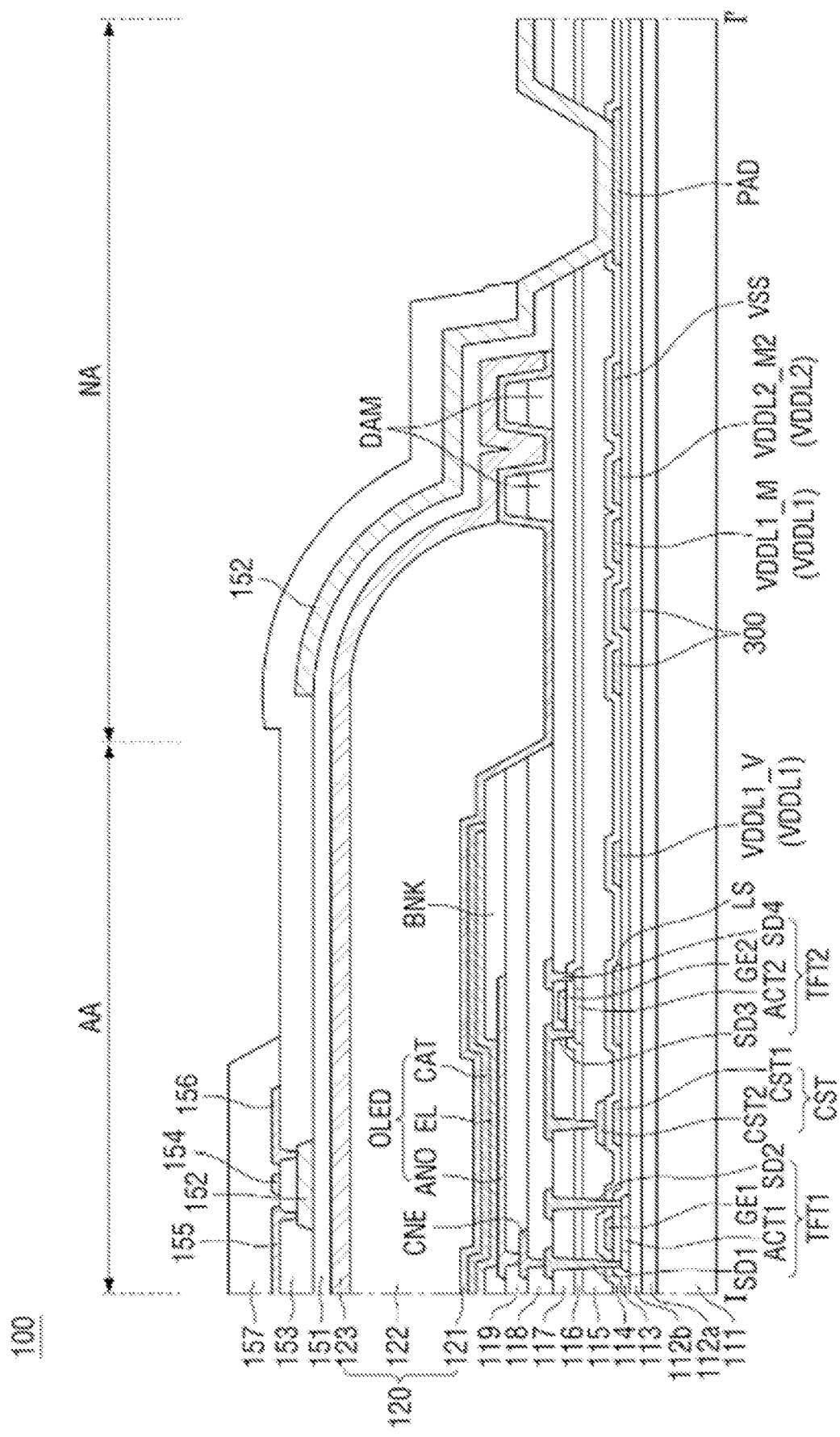
FIG. 14 is a cross-sectional view taken along line I-I' of FIG. 9 according to an embodiment.

FIG. 14 is a cross-sectional view taken along line I-I' of FIG. 9 according to one embodiment.

Referring to FIG. 14, the first vertical driving voltage line VDDL1_V, the first main driving voltage line VDDL1_M, and the 2-2nd main driving voltage line VDDL2_M2 may be located in the same layer as the low-potential driving power line VSS. However, without limitation, the first vertical driving voltage line VDDL1_V, the first main driving voltage line VDDL1_M, and the 2-2nd main driving voltage line VDDL2_M2 may be located in the same layer as the second gate electrode GE2, in the same layer as the first source and drain electrode SD1 and SD2, or in the same layer as the intermediate electrode CNE. The first vertical driving voltage line VDDL1_V may be disposed on the display area AA, and the first main driving voltage line VDDL1_M, and the 2-2nd main driving voltage line VDDL2_M2 may be disposed on the non-display area NA. At least one of the first main driving voltage line VDDL1_M, and the 2-2nd main driving voltage line VDDL2_M2 may overlap the dam DAM. Each of the first main driving voltage line VDDL1_M, and the 2-2nd main driving voltage line VDDL2_M2 may be disposed farther away from the edge of the substrate 111 than the low-potential driving power line VSS, but not limited thereto. The first main driving voltage line VDDL1_M may be disposed farther away from the edge of the substrate 111 than the 2-2nd main driving voltage line VDDL2_M2, but not limited thereto.

Figure 15:
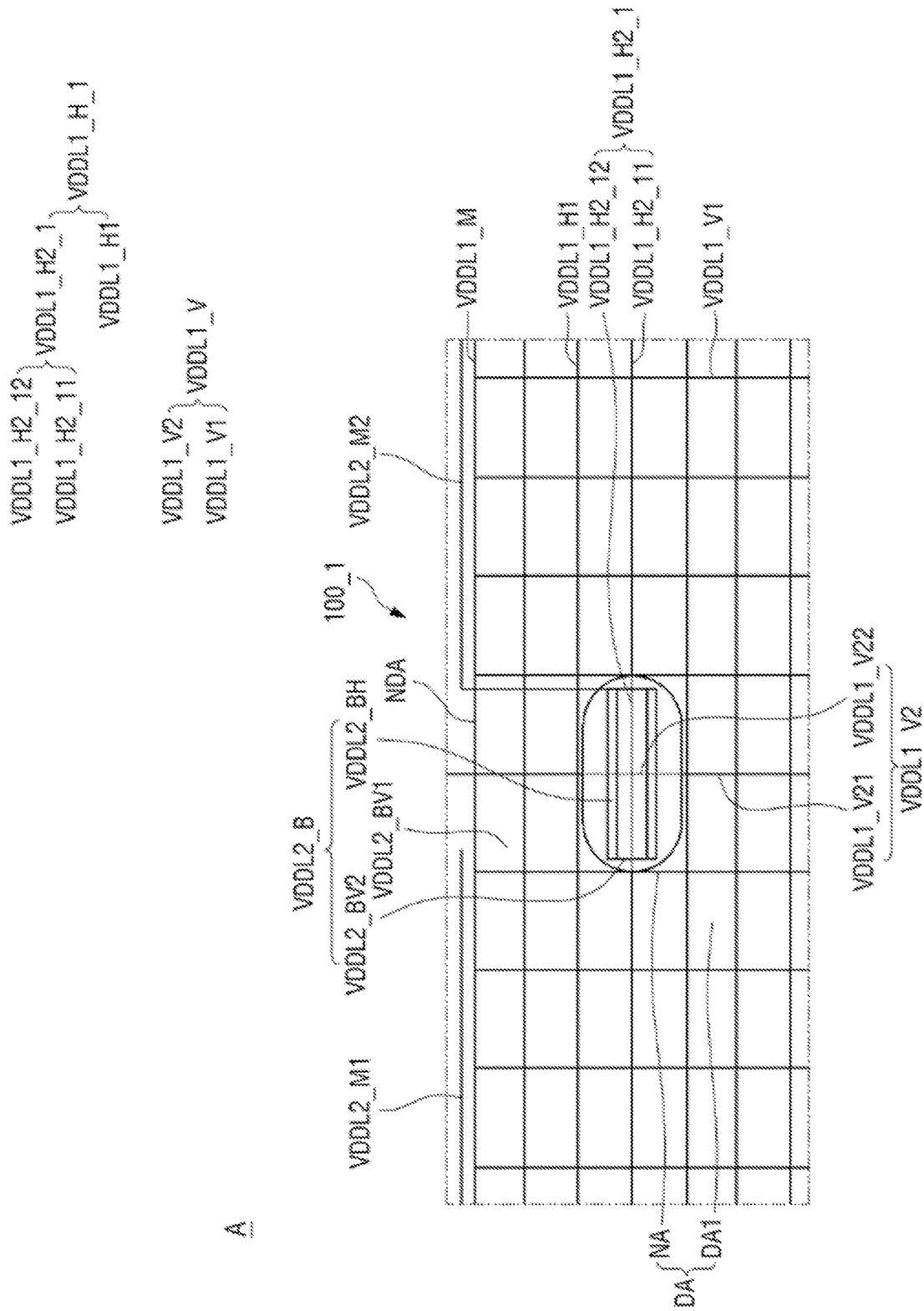
FIG. 15 is a plan view of a display panel according to another embodiment.

FIG. 15 is a plan view of a display panel according to another embodiment.

Referring to FIG. 15, a display panel 100_1 according to this embodiment is different from the display panel 100 shown in FIG. 13 in including a 1-2nd horizontal driving voltage line VDDL1_H2.

The 1-2nd horizontal driving voltage line VDDL1_H2 may include a 1-2-1st horizontal driving voltage line VDDL1_H2_11 and a 1-2-2nd horizontal driving voltage line VDDL1_H2_12. The 1-2-1st horizontal driving voltage line VDDL1_H2_11 may include a left 1-2-1st horizontal driving voltage line VDDL1_H2_11 connected to a left end of the first optical area DA1, and a right 1-2-1st horizontal driving voltage line VDDL1_H2_11 connected to a right end of the first optical area DA1. The left and right 1-2-1st horizontal driving voltage lines VDDL1_H2_11 may be spaced apart with respect to the first optical area DA1 on the plane.

The 1-2-2nd horizontal driving voltage line VDDL1_H2_12 may be connected to the left and right 1-2-1st horizontal driving voltage lines VDDL1_H2_11 spaced from each other.

The 1-2-1st horizontal driving voltage line VDDL1_H2_11 may be disposed in one of the conductive layers, and the 1-2-2nd horizontal driving voltage line VDDL1_H2_12 may be disposed in another conductive layer.

The 1-2-1st horizontal driving voltage line VDDL1_H2_11 and the 1-2-2nd horizontal driving voltage line VDDL1_H2_12 may be connected through a contact hole formed penetrating the insulating films between the conductive layers where they are respectively disposed.

For example, the 1-2-2nd horizontal driving voltage line VDDL1_H2_12 may be disposed one of the conductive layers, and prevented from being short-circuited with the lines VDDL2_BV2 disposed in another conductive layer and intersecting the 1-2-2nd horizontal driving voltage line VDDL1_112_12 on the plane.

Other descriptions have been made above with reference to FIG. 13, and thus repetitive descriptions thereof will be avoided.

Figure 16:
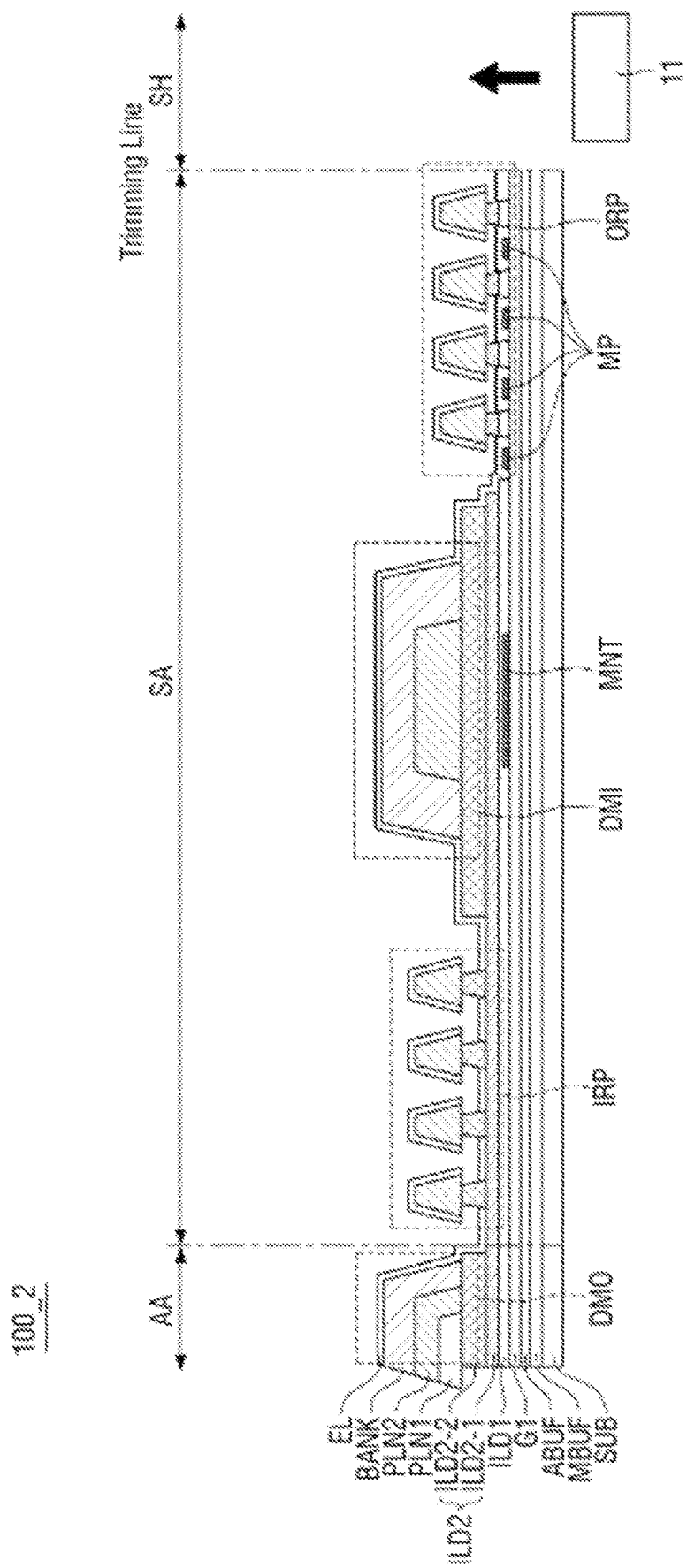
FIG. 16 is a cross-sectional view of a display panel according to still another embodiment.

FIG. 16 is a cross-sectional view of a display panel according to still another embodiment.

Referring to FIG. 16, a display panel 100_2 includes a sensor hole SH and a peripheral area SA, and a display area AA may be positioned outside the peripheral area SA. The display area AA may correspond to the display area AA of FIG. 2, the sensor hole SH may correspond to a first optical area DA1 of FIG. 9, and the peripheral area SA may correspond to an area corresponding to the first optical area DA1 and the display area AA of FIGS. 2 and 9.

In the sensor hole SH, an optical electronic device may be positioned below the display panel and at least partially overlap the sensor hole SH.

Referring to FIG. 16, the display device according to embodiments may include a "dam structure" such as an outer dam DMO positioned in the display area AA, and an inner dam DMI positioned in the peripheral area SA. Such a dam structure may include a triple-layered structure formed perpendicularly to a substrate SUB. For example, the dam structure may include a first layer formed as a planarization layer PLN, a second layer formed as a bank, and a third layer formed as a spacer (not shown).

Referring to FIG. 16, a first planarization layer PLN1 and a second planarization layer PLN2 described above are schematically illustrated as the planarization layer PLN. In such a dam structure, at least a portion of a light-emitting layer EL may be positioned on a spacer.

Some elements of the light-emitting diode may be stacked on the inner dam DMI. For example, the light-emitting layer EL and the common electrode (not shown) may be stacked in the form of climbing over the inner dam DM.

The concavo-convex pattern RP is positioned inside and outside such an inner dam DMI. The concavo-convex pattern RP may include a mountain including insulating layers ILD1, ILD2-1, ILD2-2, and a valley where at least some of the insulating layers are removed.

The light-emitting layer EL may be positioned in at least some areas on the concavo-convex pattern RP. The light-emitting layer EL may include the organic light-emitting layer including the organic material. The light-emitting layer EL may be extended from the display area AA to at least a portion of the peripheral area SA.

Referring to FIG. 16, the light-emitting layer EL is discontinuously positioned in an inner concavo-convex pattern IRP and an outer concavo-convex pattern ORP. Accordingly, even though moisture introduced from the sensor hole SH is permeated into the light-emitting layer EL positioned in the peripheral area SA, the moisture does not permeate up to the light-emitting layer EL positioned in the display area AA. In other words, the light-emitting layer EL is discontinuously present in the concavo-convex pattern RP, thereby having an effect on lengthening a moisture permeation path and an effect on preventing moisture introduced into the light-emitting layer EL from diffusing up to the display area AA.

Meanwhile, referring to FIG. 16, the inner concavo-convex pattern IRP and the outer concavo-convex pattern ORP may be different in the height of the mountain. The height of the mountain in the inner concavo-convex pattern IRP may be higher than the height of the mountain in the outer concavo-convex pattern ORP.

The inner concavo-convex pattern IRP and the outer concavo-convex pattern ORP are different in the height of the mountain because the interlayer insulating films ILD1, ILD2-1, and ILD2-2 included in the mountain are different in the inner concavo-convex pattern IRP and the outer concavo-convex pattern ORP.

For example, referring to FIG. 16, the mountain of the inner concavo-convex pattern IRP may include a 2-2th interlayer insulating film ILD2-2, and may not include a 2-1th interlayer insulating film ILD2-1 and a first interlayer insulating film ILD1. The mountain of the outer concavo-convex pattern ORP may include a 2-1th interlayer insulating film ILD2-1 and a first interlayer insulating film ILD1, and may not include a 2-2th interlayer insulating film ILD2-2.

Meanwhile, referring to FIG. 16, the bottom of the valley positioned in the outer concavo-convex pattern ORP may be positioned below the bottom of the valley positioned in the inner concavo-convex pattern IRP.

For example, the valley in the outer concavo-convex pattern ORP may be formed by removing at least a portion (e.g., the 2-1th interlayer insulating film ILD2-1) of the first interlayer insulating film ILD1 and the second interlayer insulating film ILD2.

Referring to FIG. 16, while the valley of the concavo-convex pattern RP is formed by removing the first interlayer insulating film ILD1 from the outer concavo-convex pattern ORP, a gate insulating film GI may be damaged, or insulating films (e.g., ABUF, MBUF, etc.) positioned below the gate insulating film GI may be damaged.

Thus, a metal pattern MP may be positioned in the valley positioned in the outer concavo-convex pattern ORP.

Referring to FIG. 16, the metal pattern MP may for example be disposed in the peripheral area SA, having the same shape as the valley positioned in the outer concavo-convex pattern ORP. The metal pattern MP positioned corresponding to the valley of the concavo-convex pattern RP may function as an "etching stopper."

Alternatively, the metal pattern MP may be positioned overlapping the mountain positioned in the outer concavo-convex pattern ORP. In other words, metal pattern MP may be widely positioned below the outer concavo-convex pattern ORP. In this case, the metal pattern MP may also function to prevent microcracks generated in the sensor hole SH from extending up to the display area AA. In this case, the metal pattern MP may function as not only the etching stopper but also the crack stopper.

The metal pattern MP may be positioned on the gate insulating film GI. The metal pattern MP may be formed of the same material as the gate electrode GATE of the driving transistor DT described above.

The metal pattern MP may be made of a material different from that of the insulating films (e.g., the gate insulating film GI, and the first interlayer insulating film ILD1) positioned above and below the metal pattern MP. Therefore, even though the insulating film (e.g., the first interlayer insulating film ILD1) covering the metal pattern MP is removed in an etching process or the like, the insulating film (e.g., the gate insulating film GI) positioned below the metal pattern MP is protected.

Meanwhile, an alignment mark MNT may be positioned in the peripheral area SA. The alignment mark MNT may also be referred to as an "alignment key." The alignment mark MNT may be disposed on a substrate SUB to form the sensor hole SH by etching a predetermined area from the substrate SUB.

The alignment mark MNT may be disposed in the peripheral area SA in the form of a shape corresponding to the shape of the sensor hole SH, or may be disposed around the sensor hole SH in the form of a shape different from the shape of the sensor hole SH. The alignment mark MNT may for example be positioned only in some areas among upper, lower, left and right areas of the sensor hole SH.

Meanwhile, the alignment mark MNT may be positioned on the same layer as the metal pattern MP. For example, the alignment mark MNT may be formed of the same material as the gate electrode GATE. The alignment mark MNT may be positioned on the gate insulating film GI. The alignment mark MNT may be positioned being covered with the first interlayer insulating film ILD1.

The alignment mark MNT may for example be positioned in an area overlapping the inner dam DML. The alignment mark MNT may for example be positioned between the inner concavo-convex pattern IRP and the outer concavo-convex pattern ORP.

The stacked structures or elements in the cross-sectional view of the foregoing display device of FIG. 16 may be applied to the display device 1 of FIGS. 1 to 9. The stacked structures or elements of the display device of FIG. 16 belong to the same technical field as the display device 1 of FIGS. 1 to 9, and thus combinations therebetween are obvious. Alternatively, the elements may be applied to the display area DA of the display device 1 of FIG. 3.

The foregoing description and the accompanying drawings are merely examples of the technical spirit of the disclosure, and various modifications and changes such as combinations, separations, substitutions, and variations can be made by a person having ordinary knowledge in the art to which the disclosure pertains without departing from the scope of the disclosure. Therefore, embodiments disclosed herein are intended to not limit but illustrate the technical spirits of the disclosure, and the scope of the disclosure is not limited to these embodiments. Therefore, the scope of the disclosure should be interpreted by the appended claims, and all technical spirits of the equivalents should be construed as falling into the scope of the disclosure.

DESCRIPTION OF REFERENCE NUMERALS

100: display panel
200: controller
300: gate driver
400: data driver
500: power supply

What is claimed is:

1. A display device comprising:
a display panel comprising a display area including a normal area and an optical area, a non-display area around the display area, a substrate, and a first driving voltage line and a second driving voltage line on the substrate;
an optical electronic device on the optical area;
a power supply configured to generate a driving voltage; and
a data driver configured to receive the driving voltage from the power supply,
wherein the first driving voltage line provides a first driving voltage to a pixel of the normal area, and
wherein the second driving voltage line provides a second driving voltage that is greater than the first driving voltage to a pixel of the optical area,
wherein the data driver generates the first driving voltage and the second driving voltage based on the driving voltage, supply the first driving voltage to the first driving voltage line, and supply the second driving voltage to the second driving voltage line, and
wherein the data driver comprises a first driving voltage output circuit and a regulator, the first driving voltage output circuit configured to receive the driving voltage and supply the driving voltage to the regulator, or generate the second driving voltage having a same level as the received driving voltage.

2. The display device of claim 1, wherein the regulator converts the driving voltage into the first driving voltage and supplies the first driving voltage to the first driving voltage line.

3. A display device comprising:
a display panel comprising a display area including a normal area and an optical area, a non-display area around the display area, a substrate, and a first driving voltage line and a second driving voltage line on the substrate;
an optical electronic device on the optical area;
a power supply configured to generate a driving voltage;
a data driver configured to receive the driving voltage from the power supply; and
a controller configured to provide image data received from an outside to the data driver,
wherein the first driving voltage line provides a first driving voltage to a pixel of the normal area, and
wherein the second driving voltage line provides a second driving voltage that is greater than the first driving voltage to a pixel of the optical area,
wherein the data driver generates the first driving voltage and the second driving voltage based on the driving voltage, supply the first driving voltage to the first driving voltage line, and supply the second driving voltage to the second driving voltage line, and
wherein the data driver comprises a data voltage output circuit, the data voltage output circuit configured to supply a data voltage based on a first gamma value and a data voltage based on a second gamma value greater than the first gamma value to the pixel of the normal area and the pixel of the optical area, respectively.

4. The display device of claim 3, further comprising:
a first data line connected to the pixel of the normal area; and
a second data line connected to the pixel of the optical area,
wherein the data voltage based on the first gamma value is supplied to the first data line, and the data voltage based on the second gamma value is supplied to the second data line.

5. A display device comprising:
a display panel comprising a display area including a normal area and an optical area, a non-display area around the display area, a substrate, and a first driving voltage line and a second driving voltage line on the substrate; and
an optical electronic device on the optical area,
wherein the first driving voltage line provides a first driving voltage to a pixel of the normal area, and
wherein the second driving voltage line provides a second driving voltage that is greater than the first driving voltage to a pixel of the optical area,
wherein the first driving voltage line comprises a first main driving voltage line that completely surrounds the display area on a plane, and the second driving voltage line comprises a second main driving voltage line bypassing the display area on the plane and terminates in the non-display area on an upper side on the plane.

6. The display device of claim 5, wherein the second driving voltage line further comprises a second branch driving voltage line branched from the second main driving voltage line on the plane.

7. The display device of claim 6, wherein the second branch driving voltage line comprises a vertical branch driving voltage line extending from the second main driving voltage line up to the optical area in a vertical direction on the plane, and a horizontal branch driving voltage line connected to the vertical branch driving voltage line and extending in a horizontal direction.

8. The display device of claim 7, wherein the first driving voltage line comprises a first horizontal driving voltage line connected to the first main driving voltage line and extending in the horizontal direction, and a first vertical driving voltage line connected to the first main driving voltage line and extending in the vertical direction.

9. The display device of claim 8, wherein the vertical branch driving voltage line and the first horizontal driving voltage line intersecting the vertical branch driving voltage line on the plane are disposed in different conductive layers, respectively.

10. The display device of claim 8, wherein the first vertical driving voltage line and the first horizontal driving voltage line intersecting the first vertical driving voltage line on the plane are disposed in different conductive layers, respectively.

11. A display device comprising:
a display panel comprising a display area including a normal area and an optical area, a non-display area around the display area, a substrate, and a first driving voltage line and a second driving voltage line on the substrate;
a power supply configured to generate a driving voltage; and
a data driver configured to receive the driving voltage from the power supply,
wherein a number of pixels per unit area in the normal area is more than a number of pixels per unit area in the optical area,
wherein the first driving voltage line provides a first driving voltage to a pixel of the normal area, and the second driving voltage line provides a second driving voltage that is greater than the first driving voltage to a pixel of the optical area, and
wherein the data driver generates the first driving voltage and the second driving voltage based on the driving voltage, supply the first driving voltage to the first driving voltage line, and supply the second driving voltage to the second driving voltage line,
wherein the data driver comprises a first driving voltage output circuit and a regulator, the first driving voltage output circuit configured to receive the driving voltage and supply the driving voltage to the regulator, or generates the second driving voltage having a same level as the received driving voltage.

12. The display device of claim 11, wherein the regulator converts the driving voltage into the first driving voltage and supplies the first driving voltage to the first driving voltage line.

13. A display device comprising:
a display panel comprising a display area including a normal area and an optical area, a non-display area around the display area, a substrate, and a first driving voltage line and a second driving voltage line on the substrate;
a power supply configured to generate a driving voltage;
a data driver configured to receive the driving voltage from the power supply; and
a controller configured to provide image data received from an outside to the data driver,
wherein a number of pixels per unit area in the normal area is more than a number of pixels per unit area in the optical area,
wherein the first driving voltage line provides a first driving voltage to a pixel of the normal area, and the second driving voltage line provides a second driving voltage that is greater than the first driving voltage to a pixel of the optical area, and
wherein the data driver generates the first driving voltage and the second driving voltage based on the driving voltage, supply the first driving voltage to the first driving voltage line, and supply the second driving voltage to the second driving voltage line;
wherein the data driver comprises a data voltage output circuit, the data voltage output circuit configured to supply a data voltage based on a first gamma value and a data voltage based on a second gamma value that is greater than the first gamma value to the pixel of the normal area and the pixel of the optical area, respectively.

14. The display device of claim 13, further comprising:
a first data line connected to the pixel of the normal area; and
a second data line connected to the pixel of the optical area,
wherein the data voltage based on the first gamma value is supplied to the first data line, and the data voltage based on the second gamma value is supplied to the second data line.

15. A display device comprising:
a display panel comprising a display area including a normal area and an optical area, a non-display area around the display area, a substrate, and a first driving voltage line and a second driving voltage line on the substrate,
wherein a number of pixels per unit area in the normal area is more than a number of pixels per unit area in the optical area,
wherein the first driving voltage line provides a first driving voltage to a pixel of the normal area, and the second driving voltage line provides a second driving voltage that is greater than the first driving voltage to a pixel of the optical area, and
wherein the optical area includes an emission area and a transmission area, and each of the first driving voltage line and the second driving voltage line includes a curved section or a bent section diverted outside an outer edge of the transmission area.

\* \* \* \* \*